United States Patent
Gaggl et al.

(10) Patent No.: US 9,825,645 B1
(45) Date of Patent: Nov. 21, 2017

(54) SELF-OSCILLATING DUAL-SLOPE INTEGRATING QUANTIZER FOR SIGMA DELTA MODULATORS

(71) Applicant: Infineon Technologies AG, Neubiberg (DE)

(72) Inventors: Richard Gaggl, Poertschach am Woerthersee (AT); Enrique Prefasi, Madrid (ES); Francisco Javier Perez Sanjurjo, Villach (AT); Cesare Buffa, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/389,297

(22) Filed: Dec. 22, 2016

(51) Int. Cl.
  *H03M 3/00* (2006.01)
  *H03M 1/00* (2006.01)
  *H03M 1/12* (2006.01)

(52) U.S. Cl.
  CPC .......... *H03M 3/422* (2013.01); *H03M 3/50* (2013.01); *H03M 1/00* (2013.01); *H03M 1/12* (2013.01); *H03M 3/30* (2013.01); *H03M 2201/4233* (2013.01)

(58) Field of Classification Search
  CPC ............ H03M 3/30; H03M 1/00; H03M 1/12; H03M 2201/4233; H04N 7/26085
  USPC ................. 341/143, 155, 120, 110, 166, 200
  See application file for complete search history.

(56) References Cited

U.S. PATENT DOCUMENTS

| | | | |
|---|---|---|---|
| 7,084,799 B1 | 8/2006 | Butler | |
| 7,301,490 B2 | 11/2007 | Butler | |
| 7,379,001 B2 | 5/2008 | Pedersen et al. | |
| 2013/0194125 A1* | 8/2013 | Sekimoto | H03M 1/1235 341/200 |
| 2014/0232916 A1* | 8/2014 | Nagai | H04N 5/374 348/302 |

OTHER PUBLICATIONS

Dhanasekaran et al., "A 20 MHz BW 68dB DR CT ΔΣ ADC Based on a Multi-Bit Time-Domain Quantizer and Feedback Element," in IEEE ISSCC Dig. Tech. Papers, Feb. 10, 2009, pp. 174-175.

(Continued)

*Primary Examiner* — Joseph Lauture
(74) *Attorney, Agent, or Firm* — Shumaker & Sieffert, P.A.

(57) ABSTRACT

The disclosure is directed to low-power high-resolution analog-to-digital converter (ADCs) circuits implemented with a delta-sigma modulators (DSMs). The DSM includes a single-bit, self-oscillating digital to analog converter (SB-DAC) and a dual-slope integrating quantizer that may replace an N-bit quantizer found in a conventional DSM. The integrating quantizer of this disclosure oscillates after quantization because the SB-DAC in the feedback path directly closes the DSM loop. The integrating quantizer circuit includes a switch at the input and two phases per sample cycle. During the first phase the switch sends an input analog signal to an integrator. During the second phase, the switch sends the feedback signal from the output of the self-oscillating SB-DAC to the integrator. The input to the SB-DAC may be output from a clocked comparator.

25 Claims, 12 Drawing Sheets

(56) References Cited

OTHER PUBLICATIONS

Prefasi, et al., "A 7 mW 20 MHz BW Time-Encoding Oversampling Converter Implemented in a 0.08 mm² 65 nm CMOS Circuit" IEEE Journal of Solid-State Circuits, vol. 46, No. 7, Jul. 2011, pp. 1562-1574.

Prefasi, et al., "A 0.1 mm², Wide Bandwidth Continuous-Time ΣΔ ADC Based on a Time Encoding Quantizer in 0.13 μm CMOS," IEEE Journal of Solid-State Circuits, vol. 44, No. 10, Oct. 2009, pp. 2745-2754.

Sanjurjo, et al., "An Energy-Efficient 17-bit Noise-Shaping Dual-Slope Capacitance-to-Digital Converter for MEMS Sensors," Sep. 12-15, 2016, European Solid-State Circuits Conference, ESSCIRC Conference 2016: 42nd, 4 pp.

Maghari, et al., "Noise-shaped intergrating quantisers in ΔΣ modulators," Electronics Letters, Jun. 4, 2009, vol. 45, No. 12, 2 pp.

Prefasi, et al., "Second-Order Multi-Bit ΣΔ ADC using a Pulse-Width Modulated DAC and an Integrating Quantizer," Electronics, Circuits, and Systems, 2009. ICECS 2009. 16th IEEE International Conference on Dec. 13-16, 2009, pp. 37-40.

Sanjurjo, et al., "A High-Sensitivity Reconfigurable Integrating Dual-Slope CDC for MEMS Capacitive Sensors," Ph.D. Research in Microelectronics and Electronics (PRIME), 2015 11th Conference on Jun. 29-Jul. 2, 2015 IEEE, pp. 149-152.

Hernàdez, et al., "Mutlistage ADC based on integrating quantiser and gated ring oscillator," Apr. 11, 2013, vol. 49, No. 8, 2 pp.

Maghari, "A Third-Order DT ΔΣ Modulator Using Noise-Shaped Bi-Directional Single-Slope Quantizer," IEEE Journal of Solid-State Circuits, vol. 46, No. 12, Dec. 2011, pp. 2882-2891.

Cannillo, et al., "1.4V 13μW 83dB DR CT-ΣΔ modulator with Dual-Slope quantizer and PWM DAC for biopotential signal acquisition," Proceedings of the ESSCIRC, Sep. 2011, pp. 267-270.

Straayer et al., "A 12-bit 10-MHz bandwidth, continuous-time ΣΔ sigma-delta ADC with a 5-bit, 950-MS/S VCO-based quantizer," IEEE J. Solid-State Circuits, vol. 43, No. 4, Apr. 2008, pp. 805-814.

Park et al., "A 0.13um CMOS 78 dB SNDR 87mW 20MHz BW CT-SD ADC with VCO-based integrator and quantizer," in IEEE ISSCC Dig. Tech Papers, Dec. 2009, pp. 170-171.

\* cited by examiner

SELF-OSCILLATING DUAL-SLOPE INTEGRATING QUANTIZER FOR SIGMA DELTA MODULATORS

TECHNICAL FIELD

The disclosure relates to analog to digital converter circuits.

BACKGROUND

Delta-sigma modulators (DSMs) are one of the low-power high-resolution analog-to-digital converters (ADCs) structures, DSMs are suitable for high-resolution low-to-medium bandwidth applications, such as AM or FM radio frequencies. DSMs, which may also be written as ΔΣ modulators, use both oversampling and noise-shaping to enhance their signal-to-quantization noise-ratio (SQNR). DSMs achieve noise-shaping by a low-pass continuous-time (CT) or discrete-time (DT) loop filter consisting of several integrators. The outputs of these integrators may then be fed to a multi-bit quantizer, such as a flash ADC. The output of the flash ADC is both the DSM output and the feedback that gets subtracted from the input of the modulator. This subtraction forms a negative feedback to stabilize the loop. However, as the order of the loop filter and hence the noise-shaping is increased, the power of the quantization noise will also increase and may saturate the loop. To enhance the stability and the overall performance, a larger number of back-end quantization levels in the flash ADC may be necessary. This may mean a tradeoff between the power consumption and the overall performance because increasing the number of the quantization levels in the flash ADC will not only increase the power consumption of the flash ADC itself, but also imposes larger capacitive loading on the outputs of the loop filter elements, i.e. the integrators.

There are several techniques to replace the flash ADC quantizer in a delta-sigma loop to avoid this tradeoff. A first technique may include a voltage-controlled oscillator (VCO) based quantizer that uses time and frequency as the medium. This VCO based structure may be able to achieve high-speed and a large number of quantization levels as well as increase the order of the noise-shaping by one. However, the VCO based structure may have some disadvantages, including performance degradation from signal-to-noise plus distortion ratio (SNDR), gain variations and stability concerns.

A second technique is to replace the flash ADC in a DSM with an altered integrating quantizer similar to a classical dual-slope integrating quantizer. But the altered integrating quantizer stores the charge residue in the integrator at the end of each conversion cycle for the next conversion, thereby providing first order noise shaping. In addition, the pulse-width modulation (PWM) information from altered integrating quantizer output can be used to extend the order of the DSM. This second technique may have a few different approaches.

A first approach to the second technique of replacing the flash ADC with this type of altered integrating quantizer uses a DT switched capacitor (SC) dual-slope integrating quantizer in a 2nd order SC DSM loop. The DT SC approach may need a multibit digital to analog converter (MB-DAC) in the feedback loop and a complicated digital logic control to obtain the required resolution.

A second approach may implement the altered dual-slope integrating quantizer in CT. In this way, the DSM feedback loop can use a single-bit DAC (SB-DAC) to replace the MB-DAC. For this second approach, input for the SB-DAC in the feedback loop is the PWM signal generated by the dual-slope integrating quantizer. However, this approach may suffer from current leakage in the integrating quantizer capacitor because the value of the voltage in the capacitor must be stored during a non-fixed time for the next sampling period. This effect may introduce both quantization errors and overloading of the integrating quantizer. In addition, the digital control for this second approach is quite complicated. Both the first approach and second approach to replacing the flash ADC with a dual-slope integrating quantizer may require a complex digital control scheme to ensure a linear transfer function in the integrating quantizer.

SUMMARY

In general, the disclosure is directed to a low-power high-resolution analog-to-digital converter (ADC) circuit implemented with a delta-sigma modulators (DSM). The DSM includes a single bit, self-oscillating feedback DAC and a CT dual-slope integrating quantizer that holds the quantization error after each sample as the starting point for integrating the next sample, rather than starting from a baseline as in a classical dual-slope integrating quantizer. The integrating quantizer according to the techniques of this disclosure also differs from a classical integrating quantizer insofar as the integrating quantizer of this disclosure may enter an oscillation mode after quantization has taken place because of the self-oscillating single-bit DAC in the feedback path. The integrating quantizer circuit of this disclosure may accomplish this by using a switch at the input and at least two phases per sample cycle. During the first phase the switch sends an input analog signal to the integrating quantizer. During the second phase, the switch sends the feedback signal from the output of the self-oscillating SB-DAC to the integrator. The input to the self-oscillating SB-DAC may be output from a clocked comparator.

A method comprising: receiving an analog signal at a first input of an integrating quantizer circuit, receiving a clock signal at a second input of the integrating quantizer circuit, wherein the clock signal defines a clock period, determining a sample period, wherein the sample period is the clock period multiplied by a sum, N+M, wherein N and M are integers. In response to receiving a phase one switch control signal, integrating, by the integrating quantizer circuit for M clock periods, the analog signal, and in response to receiving a phase two switch control signal, integrating, by the integrating quantizer circuit for N clock periods, a feedback signal, wherein the feedback signal comprises an output of a self-oscillating digital to analog converter (DAC).

An integrating quantizer circuit comprising: an integrator, a clocked comparator circuit, wherein the clocked comparator circuit receives a clock input and an integrator output signal, a digital to analog converter (DAC), wherein the DAC receives a bitstream signal from the clocked comparator circuit, and a switch, wherein: in response to a phase one switch control signal, the switch outputs to the integrator an analog input signal, and in response to a phase two switch control signal, the switch outputs to the integrator, a feedback signal from the DAC.

A system comprising: a processor, wherein the processor outputs a timing signal, a sensor, wherein the sensor outputs an analog signal, and an integrating quantizer circuit, wherein the integrating quantizer circuit receives the analog signal from the sensor at a first input element and the timing signal at a second input element, the integrating quantizer circuit comprising: an integrator, wherein the integrator outputs an integrator output signal, a clocked comparator circuit, wherein the clocked comparator circuit receives the timing signal from the second input element and the integrator output signal, a digital to analog converter (DAC), wherein the DAC receives a bitstream signal from the clocked comparator circuit, and a switch, wherein: the switch receives the analog signal from the first input element at a first switch input port and the switch receives a feedback signal from the DAC at a second switch input port and at a third switch input port, the switch receives a phase one switch control signal and a phase two switch control signal, in response to the phase one switch control signal, the switch outputs the analog signal to the integrator, and in response to the phase two switch control signal, the switch outputs the feedback signal from the DAC to the integrator.

The details of one or more examples of the disclosure are set forth in the accompanying drawings and the description below. Other features, objects, and advantages of the disclosure will be apparent from the description and drawings, and from the claims.

DETAILED DESCRIPTION

This disclosure is directed to low-power high-resolution analog-to-digital converter (ADCs) circuits implemented with a delta-sigma modulators (DSMs). The DSM includes a single bit, self-oscillating feedback DAC and a CT dual-slope integrating quantizer that holds the quantization error after each sample as the starting point for integrating the next sample, rather than starting from a baseline as in a classical dual-slope integrating quantizer. The integrating quantizer according to the techniques of this disclosure also differs from a classical integrating quantizer by entering an oscillation mode after quantization has taken place because of the self-oscillating single-bit DAC in the feedback path. The integrating quantizer circuit of this disclosure accomplishes this by using a switch at the input and at least two phases per sample cycle. During the first phase the switch sends an input analog signal to the integrating quantizer. During the second phase, the switch sends the feedback signal from the output of the self-oscillating SB-DAC to the integrator. The input to the self-oscillating SB-DAC may be output from a clocked comparator.

By employing a modified dual-slope integrating quantizer circuit, the techniques of this disclosure may achieve the performance of a multibit quantizer, such as a flash ADC, implemented in a DSM, but with a simplified integration complexity of a single-bit solution. The simplified circuit, and need for low-complexity control circuit may require less area on an integrated circuit, reduce cost and consume less power.

The combination of a DSM using a specific type of dual-slope integrating quantizer modified to self-oscillate after quantization, plus the possibility to tune the phase 1 and phase 2 operation, may achieve several advantages. In this disclosure, phase 1 and phase I are equivalent, as are phase 2 and phase II. Some advantages may include avoiding leakage problems with the dual-slope circuit's integrating cap and the SB-DAC may provide the same performance as an MB-DAC, but with lower complexity.

As this arrangement performs 1st order noise shaping, one element, e.g. opamp, of the DSM loop can be removed and keep the same noise shaping order. The fixed sample time may mean no leakage concern from the integration capacitor in the integrator. The dual-slope integrating quantizer implemented according to the techniques of this disclosure can be connected to a CT DSM loop with an SB-DAC, without any digital circuit to obtain PWM feedback signal. Other advantages of the integrating quantizer include a possibility to reduce clock frequency, the clocked comparator saves power over other solutions, and there may be no need for least-significant bit (LSB) compensation. These and other advantages will be described in more detail below.

Figure 1:
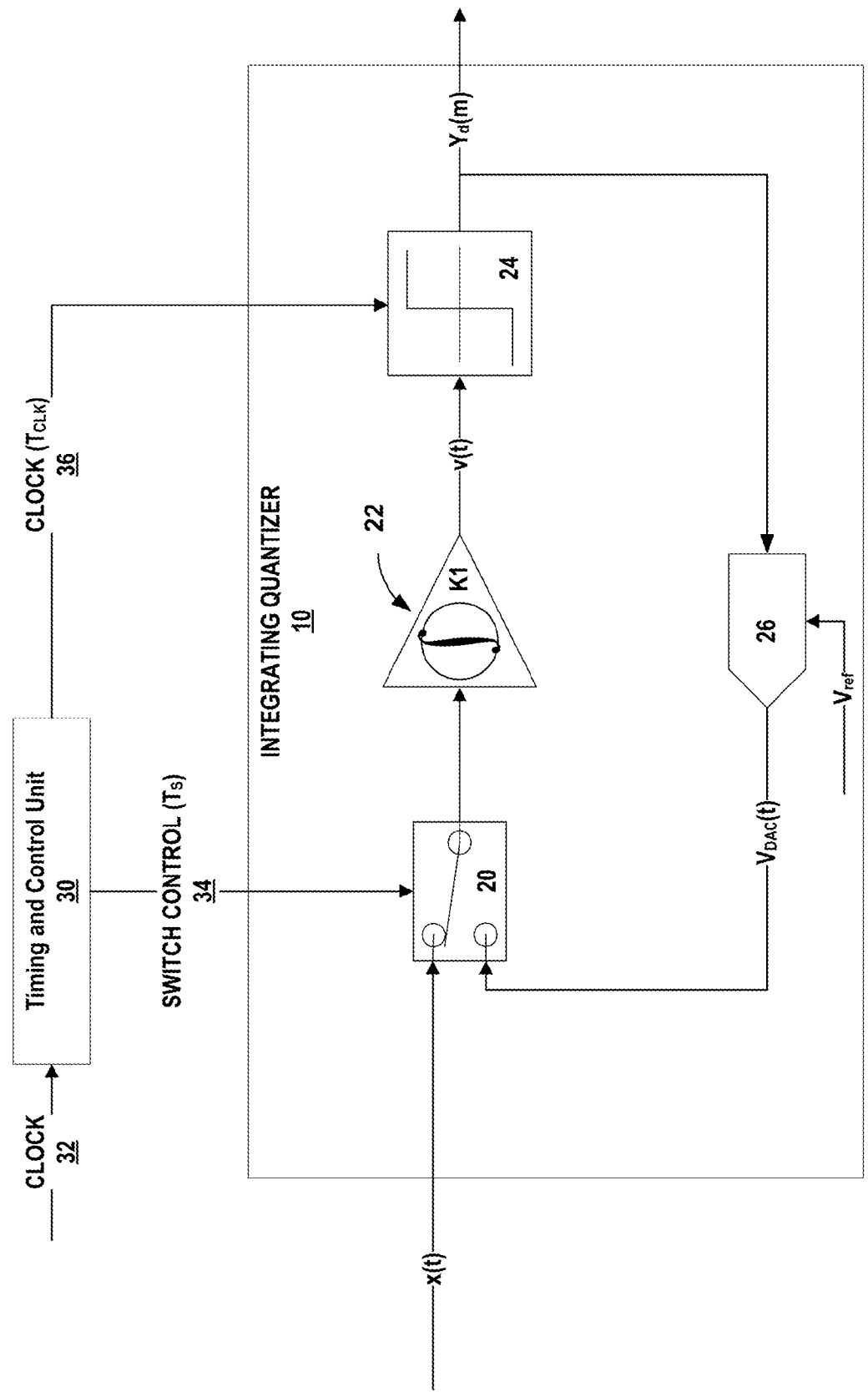
FIG. 1 is a schematic and block diagram illustrating an example dual-slope integrating quantizer circuit with oscillation in accordance with one or more techniques of this disclosure.

FIG. 1 is a schematic and block diagram illustrating an example dual-slope integrating quantizer circuit with oscillation in accordance with one or more techniques of this disclosure. FIG. 1 also depicts some clock and control circuits that may be external to the integrating quantizer circuit.

Integrating quantizer 10 may include switch (20), an integrator (22), a comparator circuit (24) and DAC 26. Integrating quantizer 10 may receive one or more signals from a timing and control unit 30, as well as an analog input x(t). Dual-slope ADCs have been shown to implement noise shaping when converted into integrating quantizers, which turn amplitude information into time encoded pulses. This arrangement has been designated as an integrating quantizer. FIG. 1 shows a simplified block diagram of this architecture, where bitstream Yd[m] is a one-bit sequence that encodes x(t) with first order shaped quantization noise.

Timing and control unit 30 may be included as part of a processor, or as a stand-alone circuit in a system. Examples of a processor may include any one or more of a microprocessor, a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry. The clock output from timing and control unit 30 may also be called a timing signal in some examples.

Figure 2A:
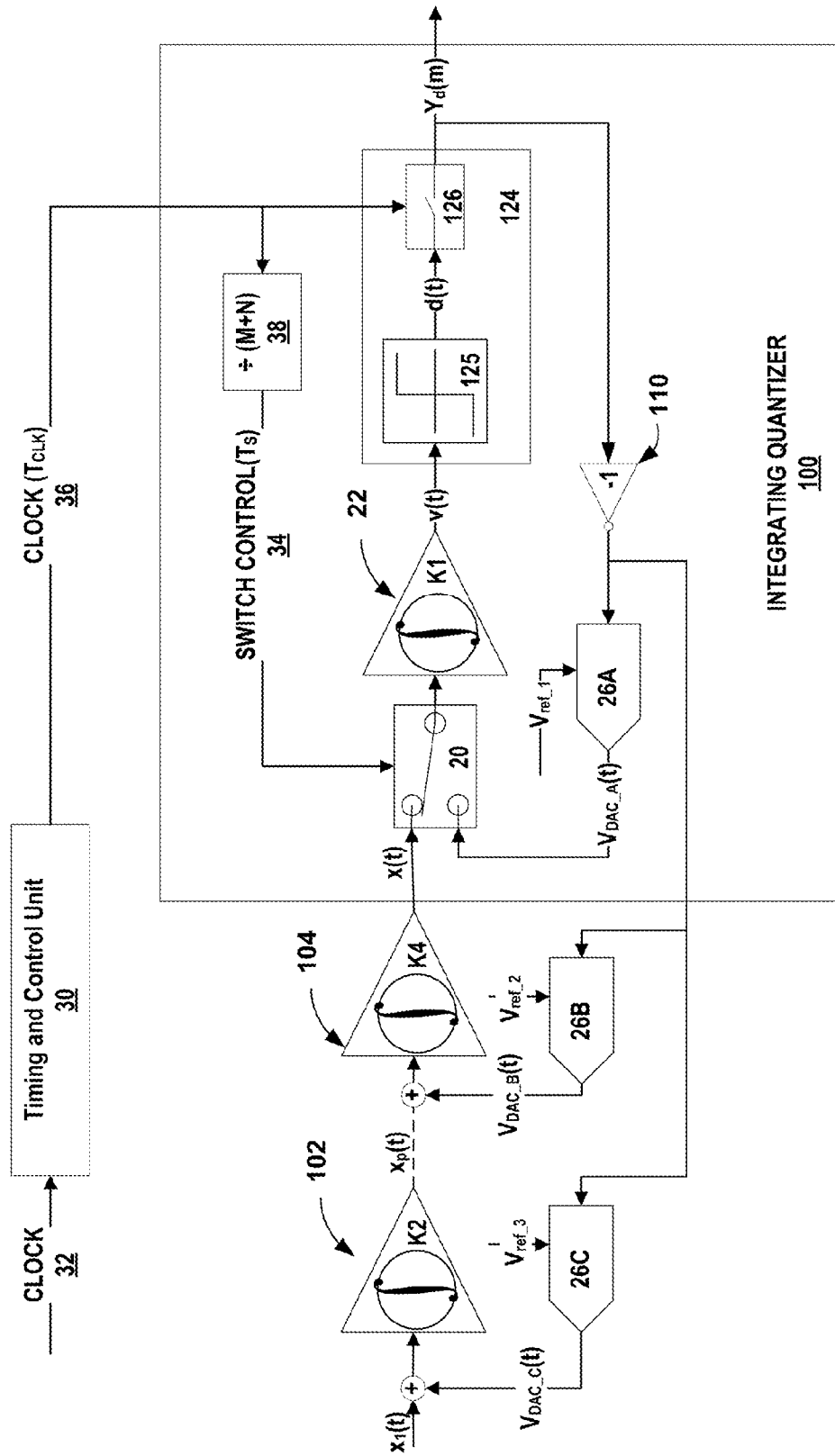
FIG. 2A is a block diagram illustrating additional detail of an integrating quantizer according to one or more techniques of this disclosure and extended to higher order noise shaping.
Figure 2B:
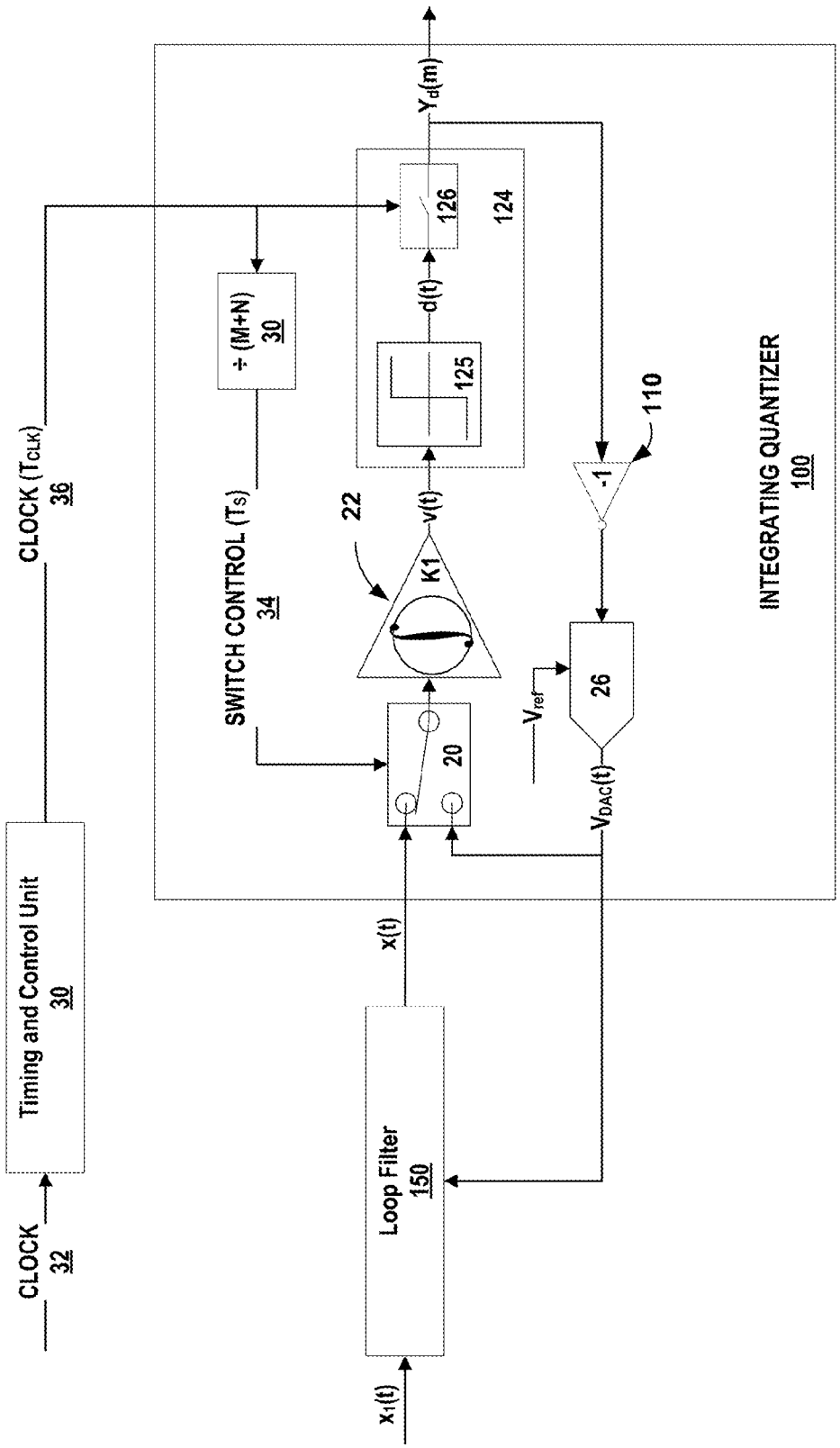
FIG. 2B is a schematic and block diagram illustrating an example circuit including a loop filter and the integrating quantizer circuit according to one or more techniques of this disclosure.
Figure 2C:
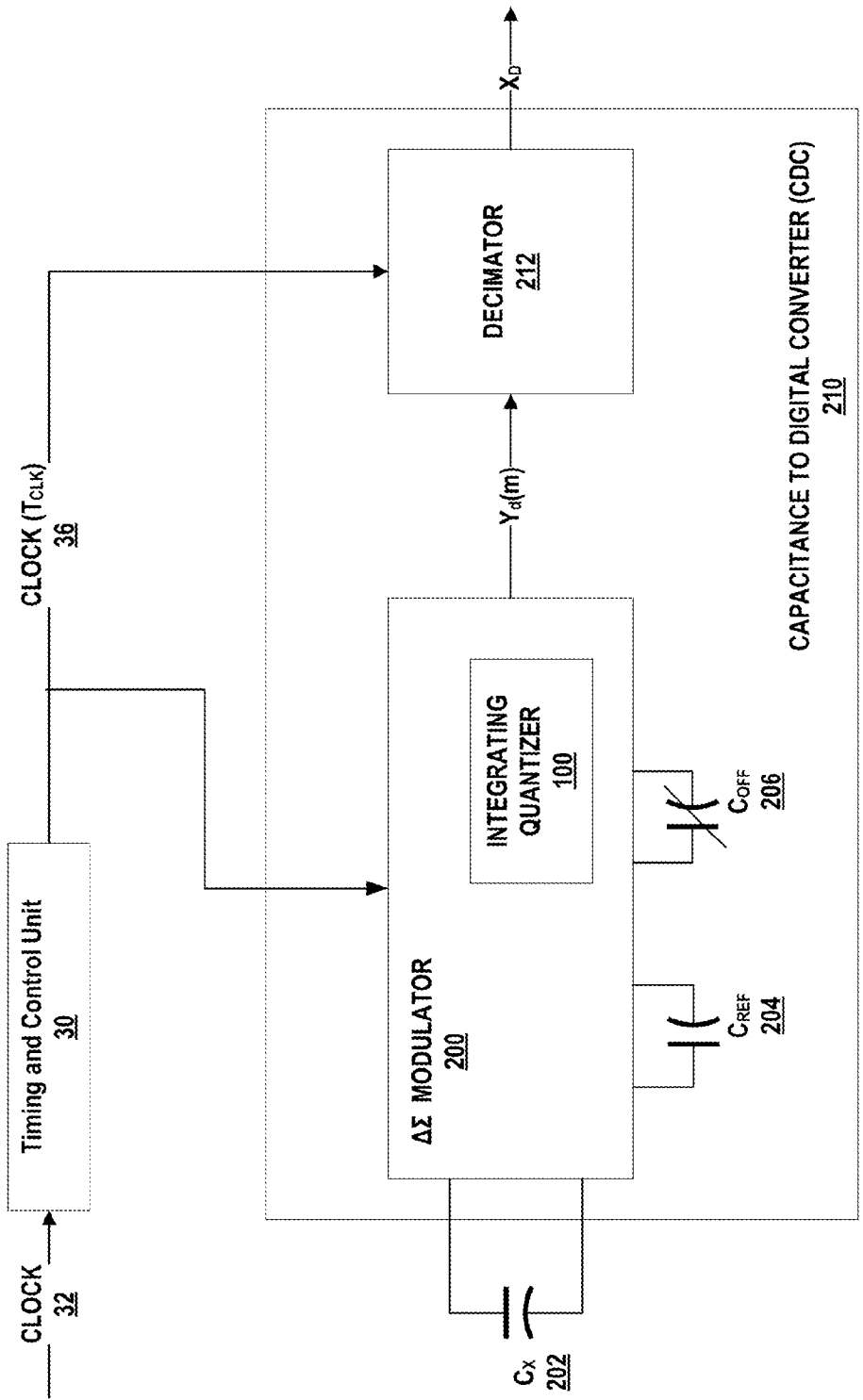
FIG. 2C is a conceptual block diagram illustrating an example application of the techniques of this disclosure to digitize the output of a capacitive MEMS sensor.
Figure 2D:
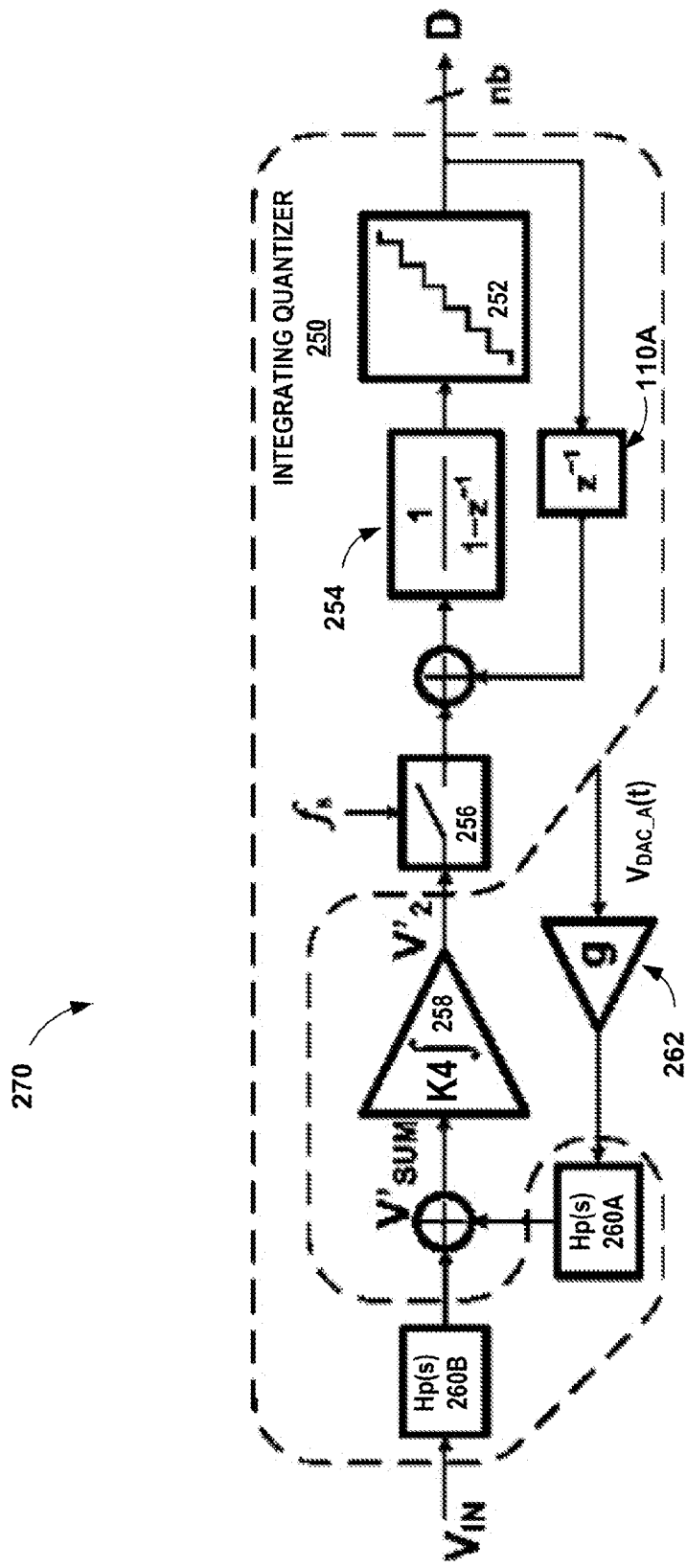
FIG. 2D is a schematic and block diagram of the integrating quantizer represented as an interpolative modulator.

Switch 20 may be considered to include three input ports and an output port. The switch control signal 34, in the example of FIG. 1 connects to a switch control input port of switch 20. Switch 20 receives switch control signal 34 to select between analog input x(t) and the feedback signal, $V_{DAC}(t)$, which is output from DAC 26. In some examples, $V_{DAC}(t)$, may be called the DAC output signal. Switch control signal 34, in the example of FIG. 1, may comprise a phase one or a phase two signal. Switch 20 includes two signal input ports. Switch 20 receives the analog input signal, x(t) at one signal input port and the feedback signal from DAC 26 at the second signal input port. In response to a phase one switch control signal 34, switch 20 outputs analog input signal, x(t) to integrator 22. In response to a phase two switch control signal 34, switch 20 outputs the feedback signal from DAC 26 to the integrator. In some examples the feedback signal output from DAC 26 is inverted in polarity compared to bitstream Yd[m]. When inverted in polarity, feedback signal, $V_{DAC}(t)$, output from DAC 26 provides a closed loop negative feedback. In some examples, DAC 26 may include a circuit to invert the polarity to a negative polarity. In other examples, switch 20 may invert the polarity or there may be an additional inverting circuit element in the feedback loop, such as shown in FIGS. 2A, 2B and 2D.

Integrator 22 may be implemented using an opamp and capacitor circuit, such as the inverters shown in FIG. 4B. Integrator 22 has a gain of K1, and outputs signal v(t) to comparator 24. The example of FIG. 1 depicts signal v(t) as either the integrated analog signal x(t) or the integrated feedback signal, depending on the position of switch 20.

Comparator 24, as shown in the example of FIG. 1 may be a single-bit, clocked, regenerative comparator circuit. Other examples of regenerative comparator circuits include Schmidt trigger comparators. Clocked comparator circuits will be described in more detail in FIGS. 2A-2D below. Comparator 24 receives as inputs both clock signal 36 with period Tclk and output signal, v(t) from integrator 22. Comparator 24 outputs bitstream signal, yd(m)A to the output of integrating quantizer 10 and to the input of DAC 26. In operation, a clocked comparator may save power over other solutions and requires only one comparator instead of numerous comparators in a flash quantizer.

In some examples, clock signal 36 output from timing and control unit 30 may have the same amplitude and frequency as clock signal 32 input to timing and control unit 30. In other examples the period Tclk of clock signal 36, may be different than clock signal 32. Clock signal 32 may be a main system clock, in some examples.

DAC 26 receives bitstream signal, Yd[m], from comparator 24. In the example of FIG. 1, DAC 26 is a single bit DAC (SB DAC) with reference signal Vref. DAC 26 outputs an analog signal to switch 20 that may be inverted in polarity from bitstream Yd[m]. As described above, this may provide a negative feedback closed loop to stabilize integrating quantizer 10.

In operation, circuit depicted in FIG. 1 differs from a classical integrating quantizer because it enters into an oscillation mode after quantization has taken place. The circuit of FIG. 1 defines sampling period Ts=1/fs for integrating quantizer 10. The integrating quantizer 10 circuit receives clock signal 36, with a period of Tclk and switch control signal 34, with a period Ts=Tclk×(M+N), where M and N are integers. Each sample period Ts is therefore of duration M*Tclk+N*Tclk. In the example of FIG. 1, switch control signal 34 controls switch 20 to connect to the analog input signal x(t) for N cycles of clock signal 36 (phase I). Switch 20 connects to feedback signal, $V_{DAC}(t)$, from DAC 26 (phase II) for M clock cycles.

The index m represents samples with period Tclk and the index n represents samples with period Ts. For example, the output of comparator 24 is Yd[m]. Also, the discrete signal acquired by the quantizer can be represented as sequence xs[n], which results from sampling x(t) after being integrated in phase I (not shown in FIG. 1). The value of xs[n] may be considered the average value of x(t) at the end of phase I after integrating x(t) during phase I.

In the example of FIG. 1, switch control signal 34 comes from timing and control unit 30. In other examples, such as FIGS. 2A and 2B, the integrating quantizer contains circuits and components to receive clock signal 36 as input and divide the frequency to generate switch control signal 34 with cycle period Ts. In an example where M=N, switch control signal 34 changes between phase I and phase II at times nTx=nTs−Ts/2. In other examples, M and N may be different values and therefore phase I and phase II may be of different lengths. N can be different from M just by changing clock phases timing. Increasing phase II increases the resolution, as will be described in more detail below. In one example application, such as a multiplexor reading different types of sensors, where each sensor may have different characteristics, an ADC digitizing the output of the various sensor may want to adjust timing between phases to optimize each sensor as well as optimize the power consumption. However, dynamically changing the value of M and N for a single sensor may cause undesirable distortion or conversion error.

To describe the operation in more detail, during phase I, integrator 22 receives an input band-limited analog signal x(t) producing an integrated analog signal v(t). In other words, v(t) is the integrated output signal of integrator 22. For integrating quantizer 10, unlike classical dual slope converters, the initial value stored in the integrator will not be null, or a baseline value, but equal to q1[n−1], which is the remaining voltage after the previous conversion cycle. In other words, integrator 22 holds the quantization error after each sample as a starting point for the next sample period. This will be described in more detail for the timing diagram depicted in FIG. 3A.

During phase II, switch 20 will feed back into the integrator the sampled output of comparator 24 (Yd[m] in FIG. 1) through single bit DAC 26 with references ±Vref. Let ds[n] be the sign of v(t) in the transition between phases I and II. The output of integrator 22, v(t) will be decreased or increased according to ds[n]=±1 until v(t) crosses zero in a time ΔT[n]. After crossing zero during phase II, yd[m] will toggle each clock cycle, Tclk, until the end of phase II. This will be described in more detail in FIG. 3A below.

Integrating quantizer 10, according to the techniques of this disclosure may achieve several advantages. One advantage is a dual-slope integrating quantizer with simplified digital control logic over other examples. A complex digital logic to drive the feedback DAC 26 is no longer needed because integrating quantizer 10 enters in an oscillation mode by itself, still keeping the noise shaping behavior.

In some examples, the final digital output value of integrating quantizer 10, Yd[m] may be computed using only an up-down counter, simplifying even more the system compare to standard solutions. In other words, after each sampling period (Ts), a decoder, such as an up-down counter, sums the number of times the comparator has changed polarity during phase II. In this way, the decoder may store a digital number proportional to the input voltage of the ADC. See also decoder 310 in FIG. 3A. The resolution of the integrating Dual-Slope ADC including an integrating quantizer, such as integrating quantizer 10, is then proportional to the length of time phase II is active (N*Tclk).

Other advantages of integrating quantizer 10 may include that the current leakage problem associated to standard dual-slope integrating quantizers is also alleviated as the integrating capacitor does not need to store the quantization error. Also, the signal generated in the quantizer by single bit DAC 26 can be used as the feedback signal of a DSM. This simplified SB DAC may have the equivalent performance of a more complex PWM DAC where multibit information is represented using single bit circuitry.

The techniques of this disclosure may also offer a further advantage in that clock frequency requirements may be relaxed. In some examples the clock frequency may be increased to undesired values to achieve the required resolution. This increased frequency may be described as oversampling ratio (OSR). OSR is the ratio of sampling frequency (fs) to twice the signal bandwidth (2fBW). The techniques of this disclosure may reduce the OSR.

An ADC using an integrating quantizer circuit according to the techniques of this disclosure may require less power and need smaller chip or integrated circuit (IC) area. The same power may yield a better performance at the same or lower realization costs. These techniques may be applied to a multimode ADC architecture to maintain the different requirements (resolution vs. bandwidth) in a single ADC which might be integrated in a monolithic environmental sensor applicable for different applications such as microphone, pressure, gas or humidity.

FIG. 2A is a block diagram illustrating additional detail of an integrating quantizer according to one or more techniques of this disclosure and extended to higher order noise shaping. Integrating quantizer 100 in FIGS. 2A-2C is equivalent in function to integrating quantizer 10 of FIG. 1.

The circuit of FIG. 2A includes integrating quantizer 100, timing and control unit 30 that receives input clock signal 32 and outputs clock signal 36, which is equivalent to the same components shown in FIG. 1. FIG. 2A also includes additional integrators 102 and 104 and additional DACs, 26B and 26C. Integrator 102, in the example of FIG. 2A has a gain of K2 while integrator 104 has a gain of K4. Other integrators may each have gains of Ki. In some examples, all the integrator gains, Ki, are approximately equal, within manufacturing and measurement tolerances.

FIG. 2A depicts the integrating quantizer according to the techniques of this disclosure extended to any order of noise shaping, and to any known architecture in the literature, including feed-forward paths. The gain value of the DACs and Ki of the integrators need to be chosen in a proper way for stability. The implementation example depicted by FIG. 2A could be done in CT or a switched capacitor (SC) discrete-time approach. In a SC implementation, no anti-aliasing filters (AAF) are added in the chain, and the bandwidth (BW) of the opamps used in integrators, such as 22, 102 and 104, should be around ten times the clock frequency ($10 \times f_{clk}$). The jitter effect for an SC implementation may be low. In a CT implementation, the signal transfer function (STF) of each integrator may include an AAF, while the BW of the opamps used for integrators should be approximately two times the clock frequency ($2 \times f_{clk}$). The jitter effect of a CT implementation is very high in comparison with the SC solution. However, for applications where the frequencies of the products are in low range, such as digitizing the output of Micro-Electro-Mechanical Systems (MEMS) sensors, such as humidity, pressure, and similar sensors, jitter may be less of a factor. Combined with the high over sampling ratio of a dual-slope integrating quantizer, may minimize the effect of the jitter. Therefore, a CT solution may be viable for this application.

Integrating quantizer 100 performs the equivalent functions of integrating quantizer 10. Integrating quantizer 100 includes switch 20, integrator 22, DAC 26A, without feedback signal $V_{DAC\_A}(t)$ and comparator circuit 124, which perform the same functions as described for integrating quantizer 10. Integrating quantizer 100 includes a divider circuit 38 that receives the input clock signal 36 and divides the input clock signal 36 into the phase I and phase II switch control signal 34. In the example of FIG. 2A, divider circuit 38 controls the values of M and N and therefore the lengths of phase I and phase II.

As with comparator 24 depicted in FIG. 1, comparator 124 may be a single-bit, clocked, regenerative comparator. In the example of comparator 124, signal d(t) is a PWM representation of input signal x(t) and Yd[m] is a one-bit sequence (bitstream) encoding x(t) with first order shaped quantization noise.

The example of integrating quantizer 100 includes inverter 110 which inverts to polarity of bitstream Yd[m] and outputs the inverted bitstream to DACs 26A-26B. DACs 26A-26C have reference inputs ±Vref_1-±Vref_3, which function as described above. In some examples, all the Vref values for the DACs may be approximately equal, within manufacturing and measurement tolerances. In other examples Vref values may be different for each DAC.

The example of FIG. 2A depicts integrator 104 outputting the analog signal x(t) to switch 20. The input to integrator 104 is the sum of the analog signal xp(t) with the feedback signal $V_{DAC\_B}(t)$, output from self-oscillating DAC 26B. Adding integrator 104 increases the noise shaping order of a DSM that includes integrating quantizer 100.

This architecture may be extended to any order. The example of FIG. 2A depicts any number of additional loop filter stage elements may be added between integrator 102 and integrator 104. Like integrator 104, the input of integrator 102 is the sum of the analog signal x1(t) with the feedback signal, $V_{DAC\_C}(t)$, output from self-oscillating DAC 26C. Integrator 102 outputs analog signal xp(t) to the next stage. Analog signal x1(t) may be the output of a sensor, or similar analog signal.

FIG. 2B is a schematic and block diagram illustrating an example circuit including a loop filter circuit and the integrating quantizer circuit according to one or more techniques of this disclosure. The example of FIG. 2B extends these techniques to any type of loop filter.

Integrating quantizer 100 in FIG. 2B functions the same as integrating quantizer 100 depicted in FIG. 2A. FIG. 2B includes the same timing and control unit 30 and clock signals 32 and 36 as described above. Loop filter 150 receives a feedback signal, $V_{DAC}(t)$ from the output of DAC 26, similar to the integrating loop filter stages depicted in the example of FIG. 2A. Loop filter 150 receives analog input x1(t) and outputs analog signal x(t) to switch 20. Switch 20 operates as described above for FIGS. 1 and 2A. Loop filter 150 may be any type of loop filter appropriate for use in an ADC. In some examples loop filter 150 may receive bit stream Yd[m] either inverted or directly from the output of comparator 124. In other words, the loop filter input may exclude DAC 26.

FIG. 2C is a conceptual block diagram illustrating an example application of the techniques of this disclosure to digitize the output of a capacitive MEMS sensor. The capacitance to digital converter (CDC) depicted in FIG. 2C is just one example application among many for an integrating quantizer according to one or more techniques of this disclosure.

The circuit depicted by FIG. 2C may be suitable for digitizing the output of capacitive Micro-Electro-Mechanical Systems (MEMS) sensors, such as an accelerometer, humidity, pressure, and similar sensors. FIG. 2C includes the same timing and control unit 30 and clock signals 32 and 36, with the same functions as described above.

CDC 210 may include DSM 200, a decimator 212, and biasing capacitors Cref 204 and Coff 206. CDC 210 may receive as input the output of a capacitive sensor Cx (202) and may output a digitized signal Xd corresponding to the capacitive sensor 202 input. In the example of a MEMS relative humidity sensor, CDC 210 receives the input analog signal from capacitive sensor Cx indicating the relative humidity at the sensor location. CDC 210 outputs a digitized signal Xd indicating the relative humidity at the sensor location.

Decimator 212 may receive clock signal 36, the bitstream output Yd[m] from DSM 200 and output digitized signal Xd. Because DSM 200 uses oversampling, many of the samples in bitstream Yd[m] may be repetitive. Removing samples may mean Xd is a simpler, lower frequency signal, yet retain all the information contained in bitstream Yd[m]. Decimator 212 may remove some samples and allow a percentage of bitstream Yd[m] through to form digitized signal Xd. For example, decimator may remove all but one sample in ten, which reduces the output frequency 10x, but may not lose any information.

DSM 200 may be a low-power high-resolution ADC circuit implemented with a DSM. DSM 200 may include a single bit, self-oscillating feedback DAC and a CT dual-slope integrating quantizer 100 that holds the quantization error after each sample as the starting point for integrating the next sample in accordance with one or more techniques of this disclosure. Integrating quantizer 100 performs the same function as the integrating quantizer circuits described in FIGS. 1, 2A, 2B and 2D. In some examples, a dual-slope integrating quantizer may also be called dual-slope integrating converter.

The example of FIG. 2C implements CDC 210 using DSM 200, which includes integrating quantizer 100 in accordance with one or more techniques of this disclosure and may result in several advantages. CDC 210 may include a significant simplification of digital logic and control circuits yet retain the same resolution as other implementations using different techniques. For example, integrating quantizer 100 in CDC 210, replaces an N-bit quantizer, which may be found in a conventional delta-sigma modulator. CDC 210 may require only one clocked comparator, rather than several, as needed for a flash ADC. CDC 210 may therefore need neither a resistor ladder nor multi-bit DAC and so DSM 200 may not need any calibration or data weighted averaging circuit for the feedback DAC, such as single-bit DAC 26. In this way, CDC 210 may be implemented on a reduced IC area and with a lower power consumption when compared to other solutions.

FIG. 2D is a schematic and block diagram of the integrating quantizer represented as an interpolative modulator. Integrating quantizer 250 is equivalent to integrating quantizer 100 described above, but represented in the frequency domain.

Integrating quantizer 250 may replace the flash quantizer of a standard DSM. As noted above, the architecture of integrating quantizer keeps the performance of the classical integrating quantizer, but simplifies the digital logic and reduces the clock frequency. The circuit of FIG. 1, described above, behaves as a discrete-time first-order DSM. This behavior will also be described in more detail below for FIG. 3A.

Figure 4:
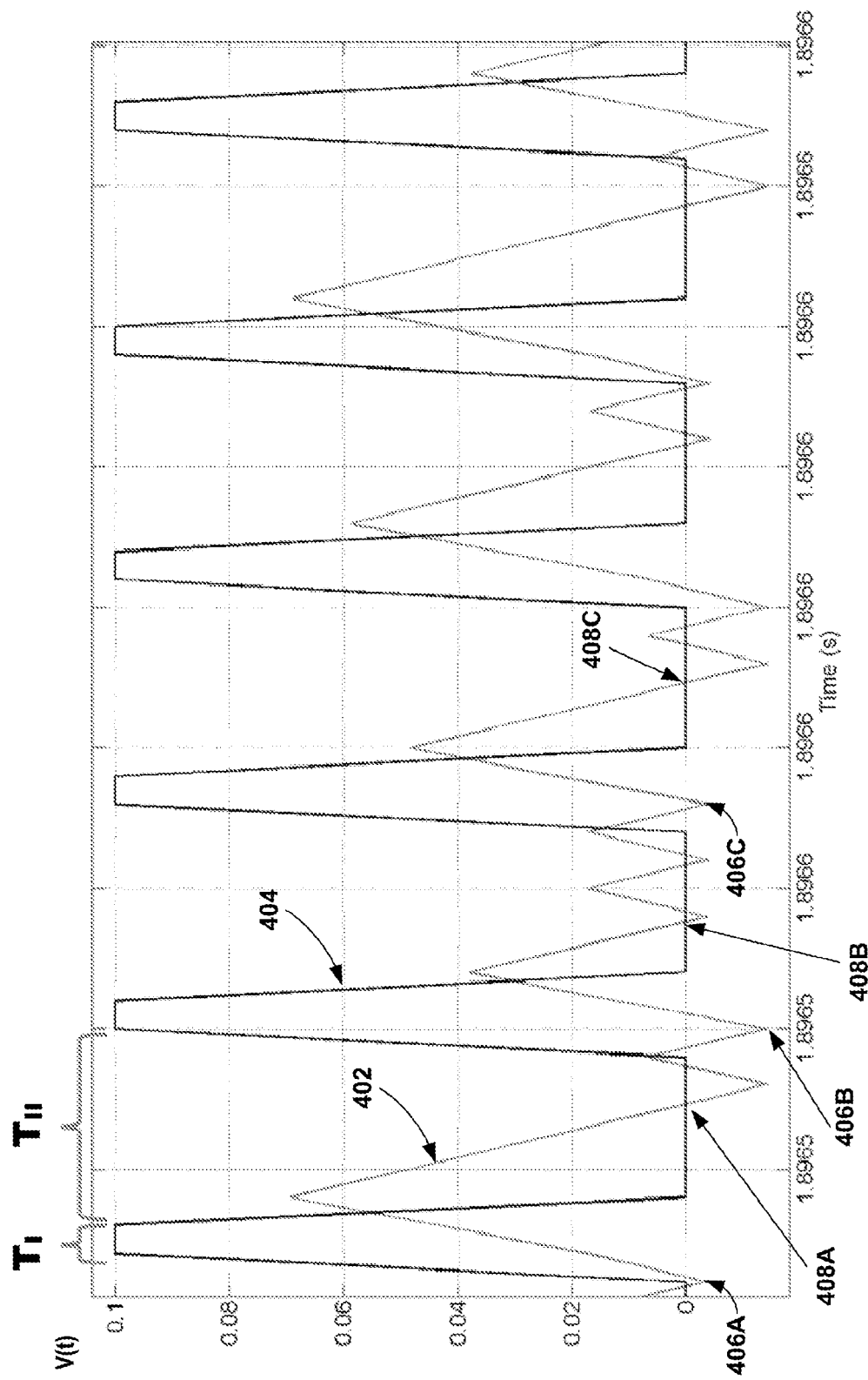
FIG. 4 is a timing diagram illustrating an example operation of an integrating quantizer circuit in which phase I is shorter than phase II, in accordance with one or more techniques of this disclosure.

A way to increase the order of the noise shaping in a DSM, as discussed above for FIG. 2A, may be to include an integrator preceding the circuit of FIG. 1. FIG. 4 represents this implementation where a new integrator is added to the chain. This connection to integrator 104, as shown in FIG. 2A, is made in a continuous time feedback. Adding integrator 104 and DAC 26B to integrating quantizer 100 gives an extra feature of an anti-alias filter (AAF) in the signal transfer function (STF).

The AAF includes a delay and an analog sinc filter with zeros at integer multiplies of frequency f0=1/(M*Tclk), where M and Tclk are the same as the values discussed above. The AAF is defined in the time domain by equation (1) and can be represented by the transfer function Hp(s) expressed in (2) with impulse response hp(t) expressed in (3), where u(t) is the Heaviside step function:

$$V_2(n+1) = \frac{1}{T_I} \int_{nT_S}^{nT_S+T_I} V_{SUM}(\tau) \cdot d\tau \qquad (1)$$

$$H_p(s) = \frac{V_x(s)}{V_2(s)} = \frac{1-e^{-T_I s}}{T_I s} e^{-T_{II} s} \qquad (2)$$

$$h_p(t) = L^{-1}(H_p(s)) = \frac{u(t-T_{II}) - u(t-T_S)}{T_I} \qquad (3)$$

The first order circuit represented in FIG. 2A shows the integrating quantizer 100, complemented by an additional integrator 104 of gain K4 and its corresponding single bit DAC (26B). FIG. 2D depicts a circuit equivalent to that portion of FIG. 2A, where integrating quantizer 250 is represented by a discrete-time 1st order DSM preceded by filter Hp(s) (260B), as described by (1) and (2). Feedback signal $V_{DAC\_A}(t)$ is physically available in 2A, although it does not correspond to any node of the discrete time equivalent of FIG. 2D. The input filter Hp(s) (260A) has been reflected to the input of the modulator and the feedback branch.

The output of the integrator 258, which equivalent to integrator 104 discussed above, connects to sampler 256 with sample frequency fs. The input to integrator 258 is the sum of the input filters 260A and 260B. Transfer function 254 receives the sum of the sampler 256 output and inverter 110A in the feedback loop. The output of transfer function 254 connects to N-bit quantizer 252. The output of N-bit quantizer 252 is the output of circuit 270 as well as connects to the input of inverter 110A for the negative feedback loop.

Circuit 270 of FIG. 2D may behave as a 2nd order discrete time DSM preceded by Hp(s). This behavior may be shown by computing the equivalent discrete time impulse response between signals $V_{DAC\_A}(t)$ and $V'2(t)$ of FIG. 2D, assuming a null input, Vin. Thus, the value of $V'2(t)$ at time $t=(n+1)Ts$ will be expressed by:

$$V'_2((n+1)T_s) = -K_2 g V_{R1} 2D[n] T_{CLK} + V'_2(nT_s) \quad (4)$$

Setting the gain of integrator 258, K4=1/Ts and using the impulse invariance principle, for g=(1+N/M) (262), the modulator accomplishes a second order noise shaping.

Compare a DSM using circuit 270d of FIG. 2D with a standard DSM with the same number of equivalent levels in the quantizer, a DSM using circuit 270 achieves the same resolution. However, a DSM using circuit 270 requires only one comparator instead of many comparators in the flash quantizer. and requires only an SB-DAC, which does not need any calibration or Data Weighted Averaging circuit as with a MB-DAC. A DSM using circuit 270 may therefore offer the advantages of reduced IC area, lower clock frequency and lower power consumption of the converter. Additionally, such a DSM may be suitable for low voltage applications.

Some additional properties of circuit 270 may include the zeros of the sinc filter Hp(s) (equation 2) may be used to attenuate a non-desired, out of band signal such as an image frequency in a low intermediate frequency (IF) receiver. To increase resolution, the architecture of this disclosure may either increase the number of bits of the integrating quantizer or extend the loop filter order, and therefore design a more aggressive noise transfer function (NTF). Also within this architecture may allow a design of a multi-standard ADC just by digital changes without any cost of increased IC area. Comparing a DSM of this disclosure to a conventional single bit modulator of equivalent signal-to-noise ratio (SNR), the only extra block is the high speed comparator, such as comparator 124, and a counter (e.g. decoder) for the output bitstream Yd[m]. However, the operational amplifiers, according to this disclosure may require significantly less bandwidth as the activity of the PWM DAC signal is lower compare to the a conventional single-bit modulator. In addition, the effect of clock jitter may be reduced as PWM DACs are more tolerant to this effect than conventional DSM single bit DACs.

A DSM according to the techniques of this disclosure may also have advantages in that the need for one or more of the following elements may be eliminated: digital logic for the dual-slope integrating quantizer feedback signal generation, LSB correction logic because N and M can be different, and offset correction logic because of less leakage in the dual-slope integrator's capacitor. Other advantages may include a more robust performance against clock jitter because of the single bit PWM signal for feedback DAC, such as DAC 26. Similarly, a DSM according to this disclosure may have less distortion because of less leakage the integrator capacitor from the lower offset as well as a stable integrating quantizer feedback loop as there is no delay due to digital circuitry, as would be required for a MB-DAC in the feedback path. This also allows for a more aggressive NTF, which makes the circuit more tolerant to excess loop delay. Finally, as N and M can be different without any penalty in area because of complex digital circuitry, therefore allows for a more power efficient and flexible integrating quantizer.

Figure 2E:
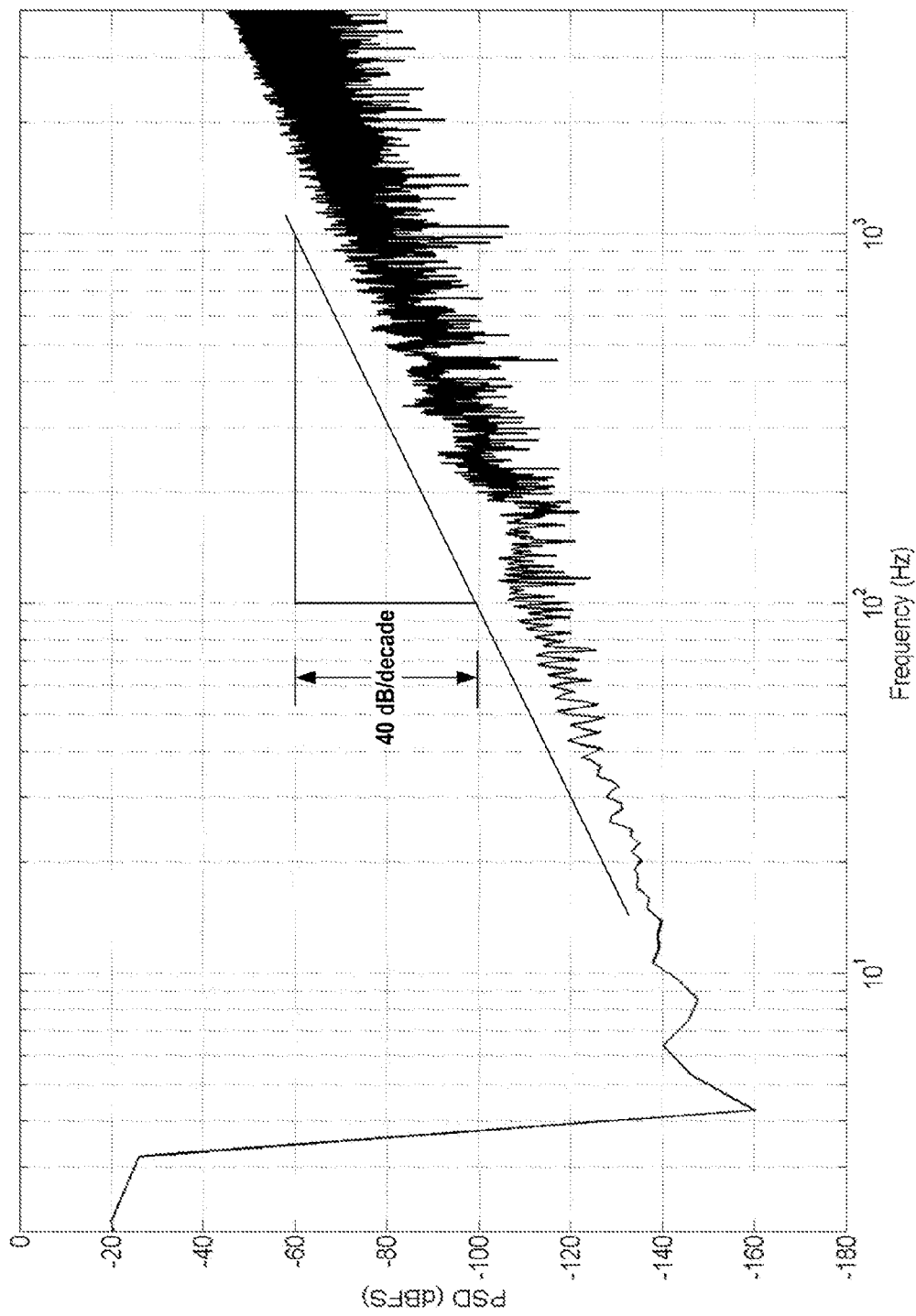
FIG. 2E depicts a simulation of the frequency response of the example circuit of FIG. 2D.

FIG. 2E depicts a simulation of the frequency response of the example circuit of FIG. 2D. The circuit 270 of 2D is equivalent to the portion of FIG. 2A, with the first order loop filter of integrator 104. Both circuits may have a similar frequency response. FIG. 2E depicts a 40 dB/decade frequency response which indicates second-order noise shaping. Therefore, the circuit of FIG. 2D includes an inherent first order response in integrating quantizer 250, and adding integrator 258 yields a second order noise shaping response. In other words, the circuit of FIG. 2D delivers second order noise shaping with the reduced complexity and other advantages described above.

Figure 3A:
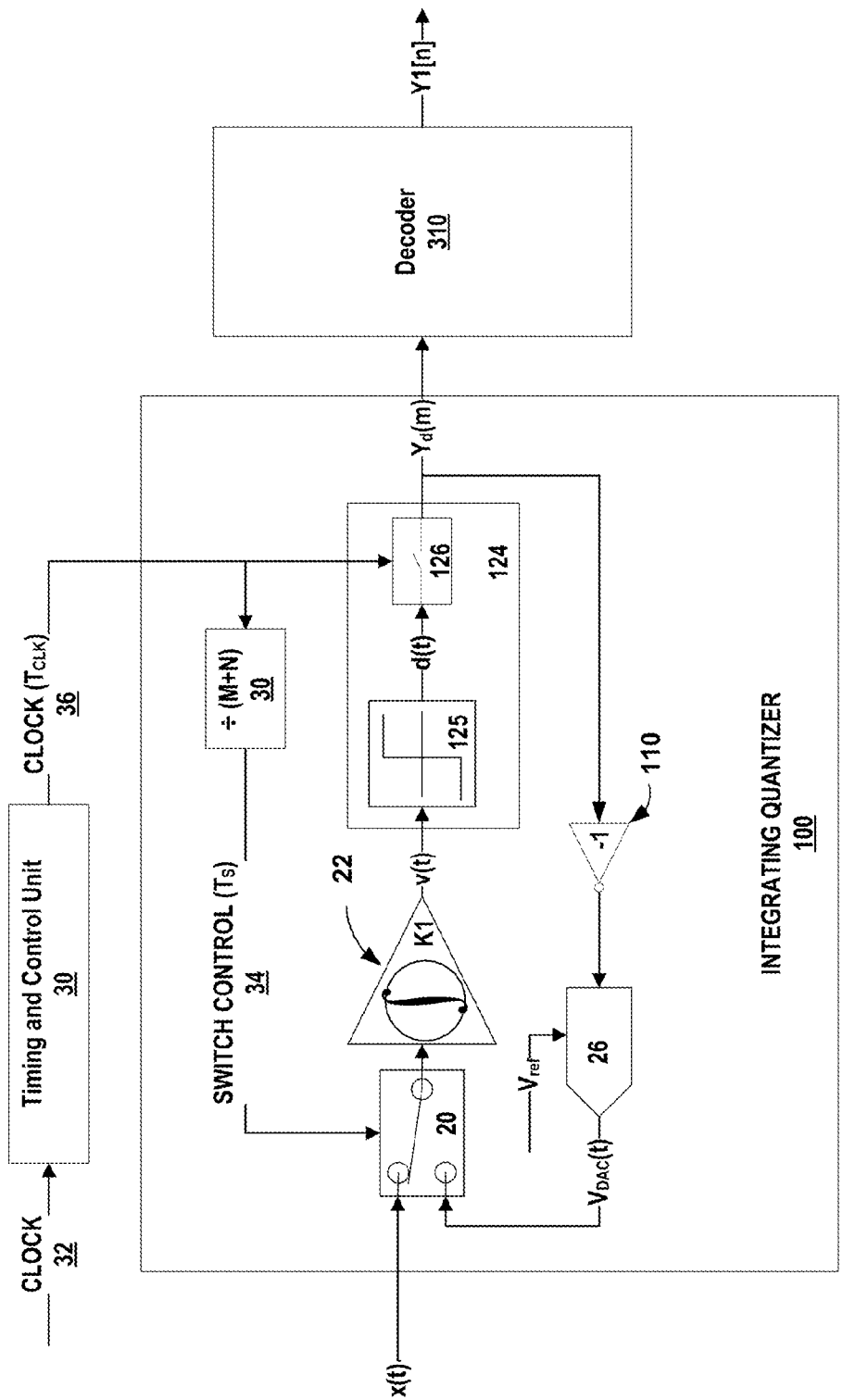
FIG. 3A is a schematic and block diagram of an integrating quantizer in accordance with one or more techniques of this disclosure, with the addition of a decoder unit.

FIG. 3A is a schematic and block diagram of an integrating quantizer in accordance with one or more techniques of this disclosure, with the addition of a decoder unit. Integrating quantizer 100 in FIG. 3A functions the same as integrating quantizer 100 depicted in FIGS. 2A and 2B. FIG. 3A includes the same timing and control unit 30 and clock signals 32 and 36 as described above as well as an additional decoder unit 310

Decoder 310, as one example, may be an up-down counter. Decoder 310 sums the number of times the comparator has changed polarity during phase II by counting the number of zero crossings of signal v(t) as encoded by bitstream signal Yd[m]. In this way, decoder 310 may store a digital number proportional to the input voltage of the ADC.

Figure 3B:
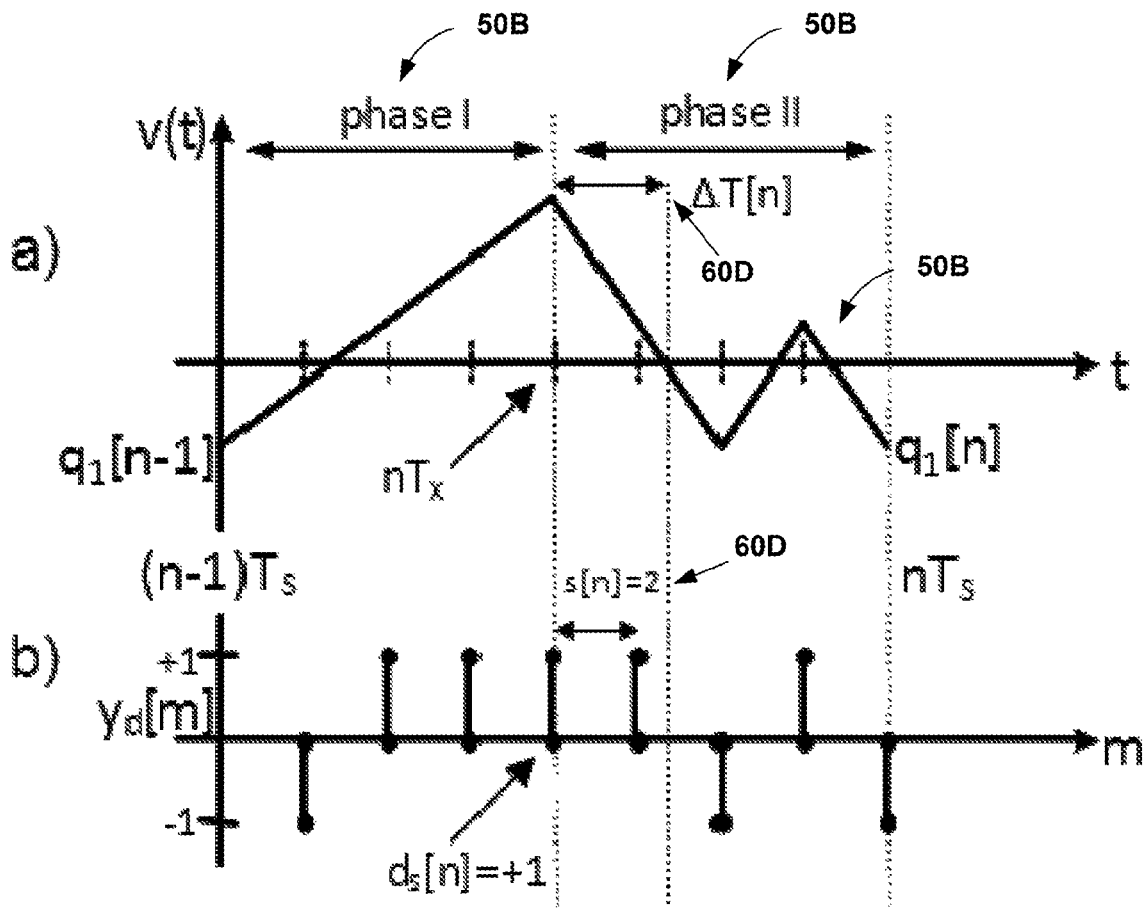
FIG. 3B is a chronograph illustrating the operation of an integrating quantizer circuit in accordance with one or more techniques of this disclosure.

FIG. 3B is a chronograph illustrating the operation of an integrating quantizer circuit in accordance with one or more techniques of this disclosure. The integrating quantizer functions described for FIGS. 3A and 3B are equivalent to integrating quantizer 10, 100 and 250 depicted in FIGS. 1-2D. In the example of FIG. 3B, phase I and phase II are of equal duration, i.e. M=N. FIG. 3B will be described in terms of the components of FIG. 3A.

The integrating quantizer operation depicted in the example of FIG. 3B differs from a classical integrating quantizer because it enters into an oscillation mode after quantization has taken place. As shown in FIG. 3A, and described above for FIG. 1 the sampling period is Ts=1/fs. The circuit receives a clock signal, such as clock signal 36, with a period Ts=Tclk×(M+N), where M and N are integers. Each sample period Ts is therefore of duration M*Tclk+N*Tclk.

A switch, such as switch 20, connects to the analog input signal x(t) for N cycles of clock signal 36 (phase I). Switch 20 connects to feedback signal, $V_{DAC}(t)$, from DAC 26 (phase II) for M clock cycles.

During phase I, the input band-limited signal x(t) will be integrated by integrator 22 producing signal v(t). Unlike classical dual slope converters, the initial value stored in the integrator will not be null but equal to q1[n−1], the remaining voltage after the previous conversion cycle. This is shown in graph (a) of FIG. 3B. The discrete signal acquired by the quantizer will be sequence xs[n] which results from sampling x(t) after being integrated in phase I. This integration can be seen as a sinc input filter, also present in dual slope ADCs:

$$x_s[n] = \frac{2}{T_s} \cdot \int_{(n-1)T_s}^{nT_s - T_s/2} x(\tau) \cdot d\tau \quad (5)$$

A sinc filter is a fast settling filter and may also be called a sin(x)/x filter. Integrator 22 output v(t), shown in graph (a), at the end of phase I will be:

$$v(nT_s-T_s/2)=v(nT_x)=q_1[n-1]+x_s[n] \quad (6)$$

During phase II, switch 20 will feed back into the integrator the sampled output of comparator 124. This is bitstream Yd[m] sent through a single bit DAC with references ±Vref, and shown by graph (b). Let ds[n] be the sign of v(t) in the transition between phases I and II. The integrator output v(t) will be decreased or increased according to ds[n]=±1 until it crosses zero in a time ΔT[n]. After crossing zero, Yd[m] will toggle each clock cycle until the end of phase II with a final value of q1[n]. Let s[n] be the number of Tclk clock cycles required for yd[m] to first cross zero in phase II, then:

$$\Delta T[n] = \frac{T_s}{2V_{ref}} \cdot d[n] \cdot (x_s[n] + q_1[n-1]), \; s[n] = \text{floor}\left(\frac{\Delta T[n]}{T_{clk}}\right)+1 \quad (7)$$

The output of the integrating quantizer y1[n] follows equation (8):

$$y_1[n] = \sum_{m=(2n-1)N}^{2nN} y_d[m] = d_s[n] \cdot \left(s[n] - \frac{1}{2}(1+(-1)^{N-s[n]})\right) \quad (8)$$

Decoder 310 computes signal y1[n] by adding up the samples of yd[m] in phase II (7). The final value of the integrator at t=nTs is q1[n], the error residue for next sample:

$$q_1[n]=V_{ref}N^{-1}\cdot(d[n]\cdot s[n]-y_1[n])+v(nT_s-(N-s[n]\cdot T_{clk}) \quad (9)$$

Combining (7), (8) and (9) and taking the Z transform it can be concluded that y1[n] encodes xs[n] with a first order shaped error q1[n]:

$$Y_1(z)=X_s(z)-(1-z^{-1})\cdot Q_1(z) \quad (10)$$

FIGS. 2D and 2E above also describe this behavior.

Figure 3C:
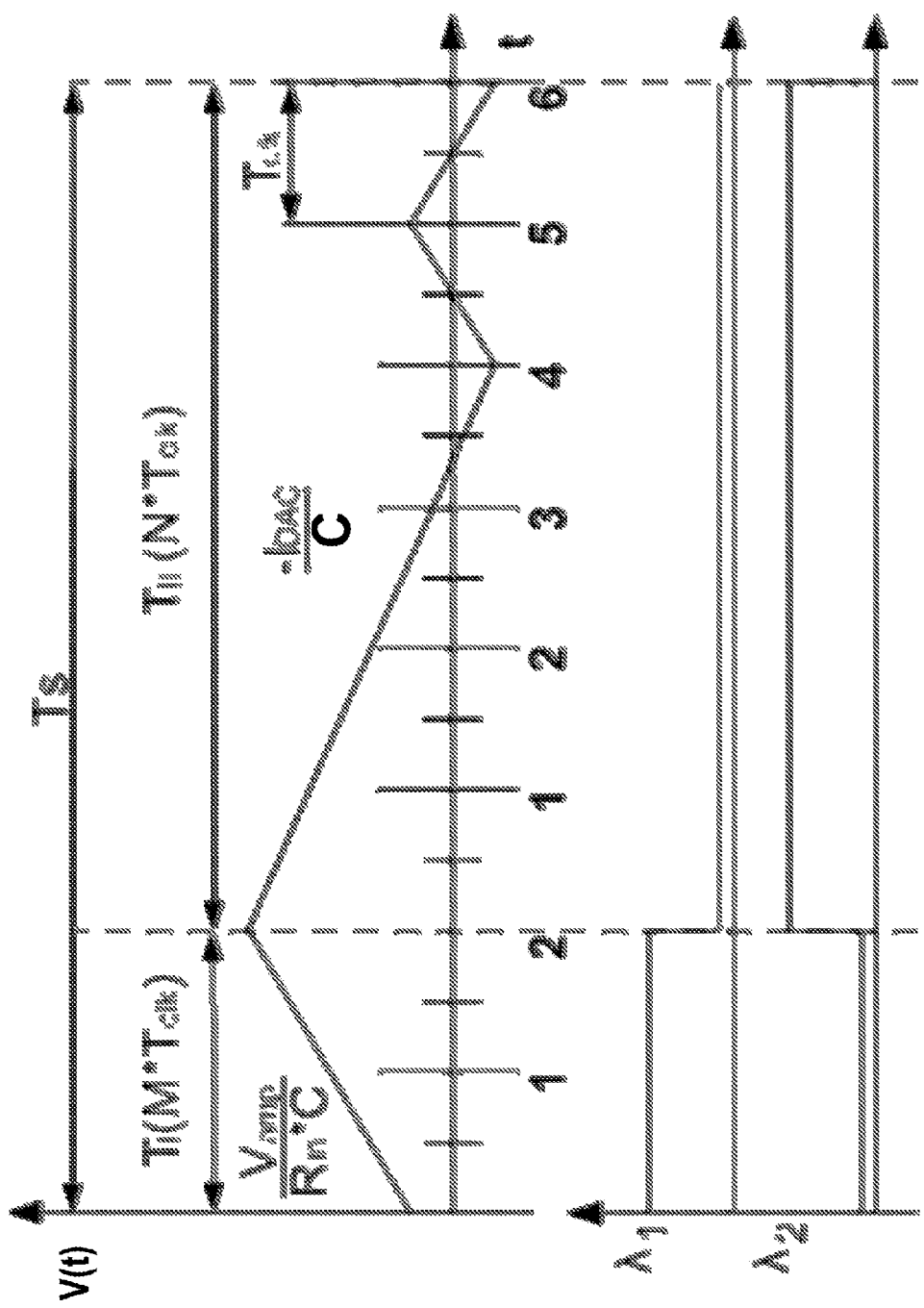
FIG. 3C is a chronograph illustrating the operation of an integrating quantizer circuit in which phase II is longer than phase I.

FIG. 3C is a chronograph illustrating the operation of an integrating quantizer circuit in which phase II is longer than phase I. In the example of FIG. 3C, the sample period Ts includes the phase 1 switch control signal, λ1 and the phase II switch control signal λ2 in which N>M.

In previous examples, of dual-slope integrating quantizers the time used to charge and discharge the capacitor was equal (N=M), such as FIG. 3B above. The integrating quantizer 100 of this disclosure has an advantage in selecting N to be greater than M does not add more complexity to a digital controller, such as would be need for existing quantizers.

FIG. 3C shows a time diagram of the voltage evolution v(t) at the output of the dual-slope integrator 22 according to the techniques of this disclosure. The example of FIG. 3C, depicts the time to charge the capacitor of integrator 22 as decreased (phase I/TI) and an increase in the time used to discharge (phase II/TII) the capacitor. As the resolution of the quantizer is proportional to the time is used to discharge the capacitor (TII), this approach may increase the resolution but keep the same sampling time (Ts=M*Tclk+N*Tclk). This is an efficient way to increase the resolution of the quantizer without increasing clock frequency. See also FIG. 5 for an example of a capacitor on an integrator.

When switch control 34, shown in FIG. 3A, is the phase one switch control signal λ1, then switch 20 outputs analog input signal, x(t) to integrator 22. Integrating quantizer 100, in response, integrates analog input signal, x(t) for M clock periods. When switch control 34 is a phase two switch control signal λ2, switch 20 outputs the feedback signal $V_{DAC}(t)$ from DAC 26. Integrating quantizer 100, in response, integrates the feedback signal for N clock periods. A longer phase II (TII) gives more time for the signal to oscillate and therefore more bits in the decoded output. During phase I, the output of integrator 22, v(t) changes according to the amplitude of the analog input signal, Vamp, at the sample time. The slope of v(t) is Vamp/(Rin*C), where Rin is an input resistance (not shown in FIG. 3A) and C is the capacitance of integrator 22 discussed above.

In addition, dual-slope quantizers have inherent robustness, which is kept in this approach. In the example architecture of FIG. 3A, the resolution is proportional to time: N*Tclk. The fix current of the DAC is:

$$I_{DAC} = \frac{V_{amp(full-scale)}}{R_{in}} \cdot \frac{T_I}{T_{II}} \quad (11)$$

Equation (11) shows that the constant current used in the discharging phase does not depend on the capacitor value. Moreover, it depends in the ratio between TI and TII and not in the absolute value of discharging time TII. This fact makes the quantizer very flexible and robust. The term robust, in this disclosure, means the circuit may be less dependent on component variability and operating conditions, like changes in temperature.

FIG. 4 is a timing diagram illustrating an example operation of an integrating quantizer circuit in which phase I is shorter than phase II, in accordance with one or more techniques of this disclosure. Similar to FIG. 3C above, phase II is longer than phase I and therefore N>M, in the example of FIG. 4. In some examples, phase II may be twice as long as phase I.

Figure 5:
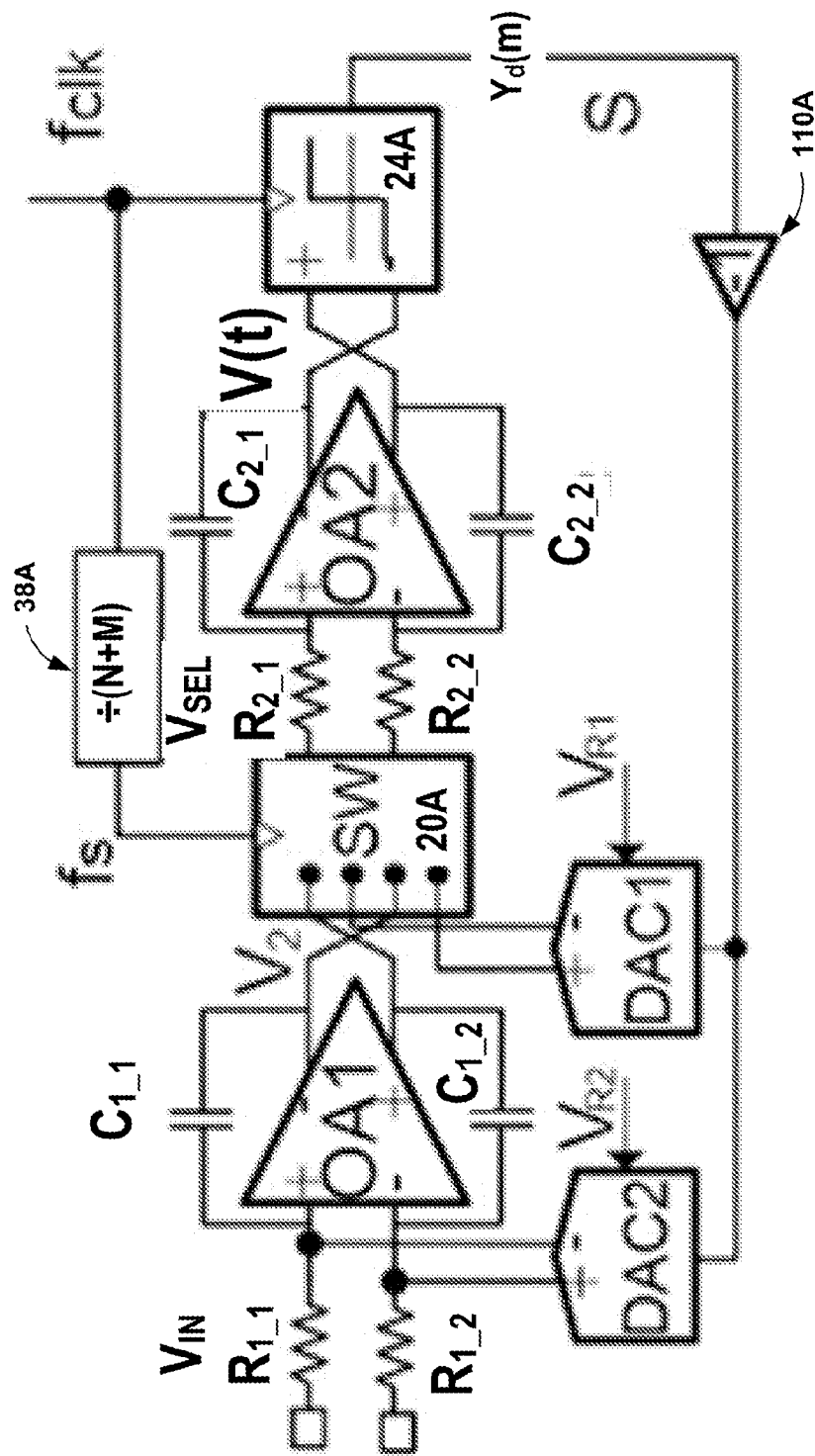
FIG. 5 is a schematic diagram illustrating one possible example implementation of a second order integrating quantizer circuit, in accordance with one or more techniques of this disclosure.

The example of FIG. 4 illustrates an output, v(t) (402) of an integrator, such as integrator 22, or OA2 shown in FIG. 5. Graph 404 depicts the charge and discharge phase signal, which may be similar to switch control signal 34.

Example integrator output v(t) (402) is depicted as beginning integration for a sample cycle at the end of the previous sample cycle. For example, 406A depicts both the end point, q[n−1] of the previous cycle and the start point of the first sample period. Similarly, 406B depicts the end point q[n] of the first sample period and the beginning of the second sample period q[n+1]. The third sample period starts at q[n+1] (406B) and ends at q[n+2] (406C). FIG. 4 depicts the remaining sample periods in a similar manner.

After integrator output v(t) crosses zero during phase II, the signal begins to oscillate, as described above. In the example of FIG. 4, 408A is the point where v(t) crosses zero for the first sample period is 408A. After this point v(t) begins to oscillate until the end of phase II. Similarly, for the second and third sample period, the points 408B and 408C show the zero-crossing point and where v(t) begins to oscillate during phase II. As described above, the longer phase II allows more time for v(t) to cross zero and more clock periods in which to oscillate. This longer phase II may increase the resolution of the integrating quantizer circuit.

FIG. 5 is a schematic diagram illustrating one possible example implementation of a second order integrating quantizer circuit, in accordance with one or more techniques of this disclosure. The circuit of FIG. 5 is equivalent to the second order integrating quantizer circuit 270 of FIG. 2D and the second order portion of the circuit depicted by FIG. 2A, as described above.

The circuit of FIG. 5 includes opamps OA1 and OA2, configured as integrators, switch 20A, comparator 24A, inverter 110A, DAC1, DAC2 and divider circuit 38A. Switch 20A, DAC1, DAC 2, comparator 24A, inverter 110A and divider circuit 38A all perform the same functions as similar circuit elements described above in FIGS. 1-2C. DAC 1 is equivalent to DAC 26A and DAC2 is equivalent to DAC 26B. VR1 is equivalent to Vref_1 and VR2 is equivalent to Vref_2.

The non-inverting input of OA2 connects to the selected voltage (Vsel) output of switch 20A through resistor R2-1. Vsel depends on the position of switch 20A, as described above. During phase 1, Vsel is the integrated analog input signal from OA1. During phase 2, Vsel is the feedback signal from DAC1. OA2 is connected as a differential integrating amplifier with R2-2 connecting switch 20A to the non-inverting input of OA1. C2-2 connects the non-inverting input of OA2 to the positive output of OA2 as well as the positive input of comparator 24A. C2-1 connects the non-inverting input of OA2 to the negative output of OA2 as well as the negative input of comparator 24A.

Comparator 24A receives clock signal fclk and outputs Yd[m] to inverter 110A. Inverter 110A outputs −Yd[m] to the inputs of DAC1 and DAC2. Both the positive and negative outputs of DAC 1 connect to switch 20A.

The negative output of DAC2 connects to the non-inverting input of OA1, while the positive output of DAC 2 connects to the inverting input of OA1. OA1 receives analog input signal Vin through resistors R1-1 and R1-2. Resistor R1-1 connects to the non-inverting input of OA1 while resistor R1-2 connects to the inverting input of OA1. Capacitor C1-1 connects the non-inverting input of OA1 to the negative output of OA1. Capacitor C1-2 connects the inverting input of OA1 to the positive output of OA1. OA1 outputs an integrated analog signal V2 to switch 20A. Analog signal V2 is equivalent to analog signal x(t) described above for FIGS. 2A-2B.

The example circuit level implementation of the integrating quantizer depicted by FIG. 5 may include the following advantages. The integrating quantizer enters oscillation mode by itself, thus providing noise shaping without need of complex digital logic. Less complex digital logic may allow less area on an IC and lower current consumption. The integrating quantizer oscillation operating mode relaxes problem related to leakage current in C2-2 because integrating capacitors do not need to store quantization error. Also, the integrating quantizer oscillation operating mode relaxes comparator design specifications because of the multiple crossing during phase II because the offset of comparator 24A has less impact.

Additional advantages of the circuit of FIG. 5 may include the implementation of the integrating quantizer is simplified to a single-bit structure. A single-bit structure may have no need of computational logic and less switching activity, which may result in lower power consumption. The simplified single-bit integrating quantizer still may achieve the equivalent performance of a complex multibit quantizer. A clocking scheme as described above, together with unbalanced charge/discharge phases may allow an increase the quantizer resolution, but keeps the same sampling time. The clocking scheme may therefore allow the higher resolution without increasing speed and power consumption.

In other examples, different approaches could be chosen as integrators to obtain a high resolution in the output. System linearity is desirable when selecting an integrator in this kind of application. Active RC integrators may provide the desirable linearity along with low power consumption.

Other criteria for integrator selection may include a tradeoff between thermal noise and current through the integrator. The selection of R1-1 and R2-2 may depend on the maximum value of thermal noise power allowed, according to the equation:

$$P_{ThN} = 4 \cdot K \cdot T \cdot R \cdot BW \quad (12)$$

Other considerations for the values of R and C may include adapting the circuit to a desired sampling frequency (fs) as well as to allow the circuit to operate in the full scale to the supply voltage (VDD). Operating in full scale may allow the maximum resolution while avoiding saturation.

Figure 6:
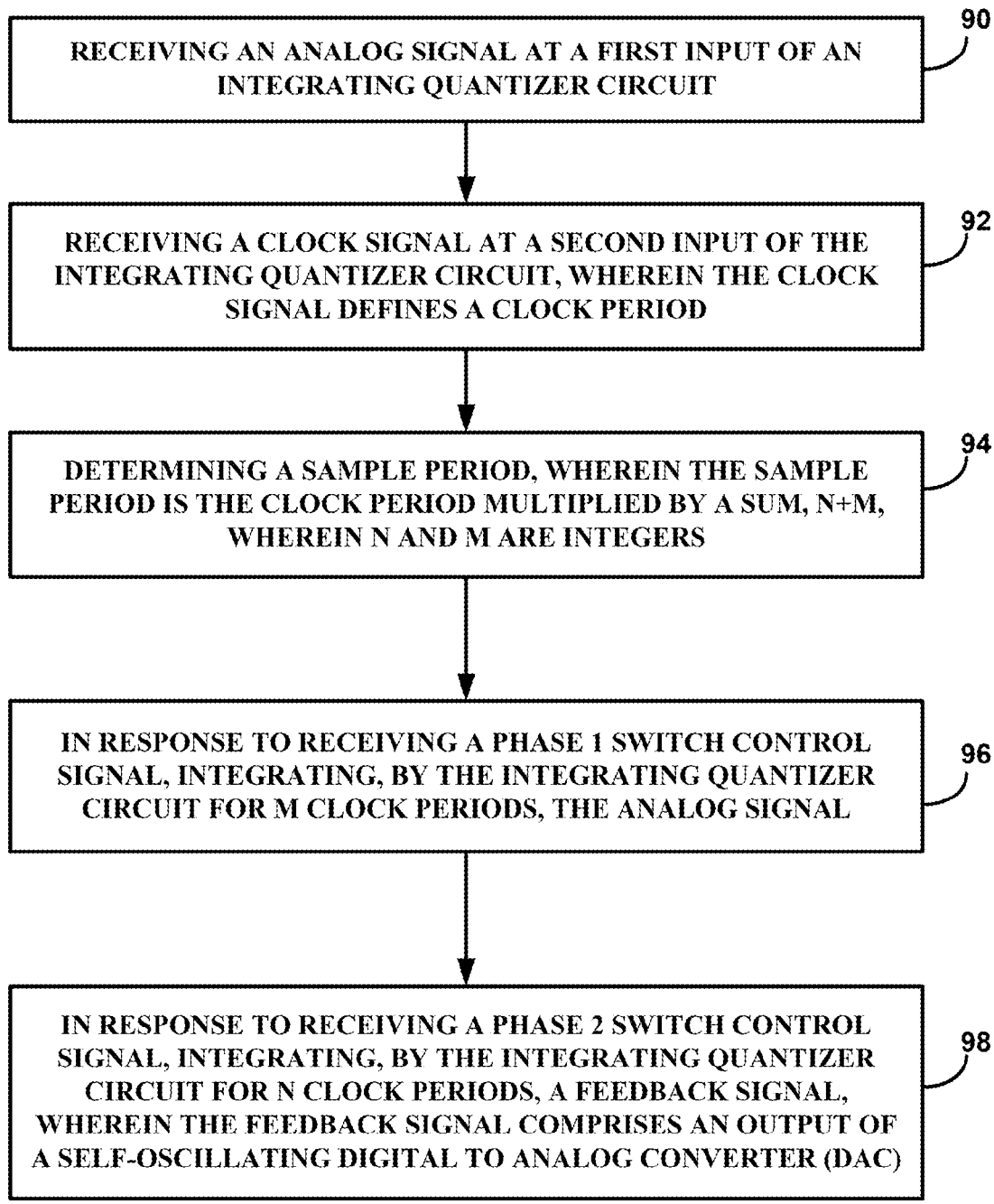
FIG. 6 is flowchart depicting the operation of an integrating quantizer in accordance with one or more techniques of this disclosure.

FIG. 6 is a flowchart depicting the operation of an integrating quantizer circuit in accordance with one or more techniques of this disclosure. The operation of the integrating quantizer depicted in FIG. 6 will be described in reference to FIG. 1.

An integrating quanitzer circuit, such as integrating quantizer 10, may receive an analog signal, x(t) at a first input (90). Analog signal x(t) may be any signal to be digitized, such as the output of a MEMS sensor as depicted in FIG. 2C. Analog signal x(t) is an input to switch 20.

At a second input, integrating quantizer 10 may receive a clock input with a clock period Tclk, such as clock signal 36 (92). In the example of FIG. 1, integrating quanitizer 10 receives clock signal 36, with period Tclk and a separate switch control signal 34 with period Ts. However, in other examples, such as FIGS. 2A-2B, the integrating quantizer circuit may receive a single clock signal with period Tclk and include a divider circuit, such as divider circuit 38.

Either a component of the integrating quanitizer circuit, such as divider circuit 38, or an external component, such as timing and control unit 30, may determine a sample period (94). The sample period, Ts, is the clock period, Tclk, multiplied by the sum of the length of phase I and phase II. In other words, the sample period is the clock period multiplied by M+N, where M is the number of clock cycles in phase I and N is the number of clock cycles in phase II.

In response to a phase I switch control signal, integrating quanizer 10 may integrate the analog signal, x(t) for the duration of phase I (96). As described above, this results in xs[n], which may be considered the average value of x(t) during phase I of sample period n. For example, xs[1] is the average value of x(t) for sample period 1, while xs[2] is the average value of x(t) for sample period 2. As described above, for example in FIG. 4, the starting value for the integration is the end value for the previous sample period, unlike a classical dual-slope integrating quantizer. This is the quantization error after each sample used as the starting point for integrating the next sample.

In response to receiving a phase II switch control signal, integrating quanitizer 10, may integrate the feedback signal $V_{DAC}(t)$ during phase II (98). Feedback signal $V_{DAC}(t)$ is the output of self-oscillating DAC 26. The integrating quantizer according to the techniques of this disclosure also differs from a classical integrating quantizer by entering an oscillation mode after quantization has taken place because of the self-oscillating single-bit DAC in the feedback path. By holding the quantization error as a starting point for the next sample period, and using a self-oscillating DAC, an integrating quantizer in accordance with the techniques of this disclosure may achieve the performance of a multibit quantizer, such as a flash ADC, but with a simplified integration complexity of a single-bit solution. Implemented, for example, in a delta-sigma modulator (DSM), the simplified circuit, and need for low-complexity control circuit may require less area on an integrated circuit, reduce cost and consume less power.

Example 1

A method comprising: receiving an analog signal at a first input of an integrating quantizer circuit; receiving a clock signal at a second input of the integrating quantizer circuit, wherein the clock signal defines a clock period; determining a sample period, wherein the sample period is the clock period multiplied by a sum, N+M, wherein N and M are integers; in response to receiving a phase one switch control signal, integrating, by the integrating quantizer circuit for M clock periods, the analog signal; and in response to receiving a phase two switch control signal, integrating, by the integrating quantizer circuit for N clock periods, a feedback signal, wherein the feedback signal comprises an output of a self-oscillating digital to analog converter (DAC).

Example 2

The method of example 1, wherein an integration final value for a first sample cycle of a plurality of sample cycles is an integration initial value for the next sample cycle of the plurality of sample cycle.

Example 3

The method of any of examples 1-2 or combinations thereof, wherein a feedback input to a self-oscillating DAC comprises an inverted polarity output of a comparator, and wherein the comparator is single-bit, clocked, regenerative comparator, the method further comprising: in response to receiving a phase one signal, receiving, by the comparator, the integrated analog signal; and in response to receiving a phase two signal, receiving, by the comparator, the integrated feedback signal.

Example 4

The method of any of examples 1-3 or combinations thereof, wherein the self-oscillating DAC is a single bit DAC and wherein the feedback signal from the DAC closes a loop of a delta-sigma modulator (DSM).

Example 5

The method of any of examples 1-4 or combinations thereof, wherein the analog signal is a first analog signal, and the self-oscillating DAC is a first self-oscillating DAC, the method further comprising: receiving a second analog signal at a third input of the integrating quantizer circuit; summing the second analog signal with an output of a second self-oscillating DAC, wherein the second self-oscillating DAC: receives the inverted polarity output of the comparator, and receives a second reference voltage; and integrating the sum of the second analog input and the output of the second self-oscillating DAC, wherein the integrated analog signal to the comparator comprises the integrated sum of the second analog input and the output of the second self-oscillating DAC.

Example 6

The method of any of examples 1-5 or combinations thereof, wherein the first reference voltage is approximately equal to the second reference voltage.

Example 7

The method of any of examples 1-6 or combinations thereof, wherein N equals M.

Example 8

The method of any of examples 1-7 or combinations thereof, wherein the analog signal is the output of a capacitive sensor.

Example 9

The method of any of examples 1-8 or combinations thereof, wherein a component of the integrating quantizer determines the sample period.

Example 10

An integrating quantizer circuit comprising: an integrator; a clocked comparator circuit, wherein the clocked comparator circuit receives a clock input and an integrator output signal; a digital to analog converter (DAC), wherein the DAC receives a bitstream signal from the clocked comparator circuit; and a switch, wherein: in response to a phase one switch control signal, the switch outputs to the integrator an analog input signal; and in response to a phase two switch control signal, the switch outputs to the integrator, a feedback signal from the DAC.

Example 11

The integrating quantizer circuit of example 10, wherein the clocked comparator circuit is a single-bit, clocked, regenerative comparator.

Example 12

The integrating quantizer circuit of any of examples 10-11 or combinations thereof, wherein the DAC is a self-oscillating DAC.

Example 13

The integrating quantizer circuit of any of examples 10-12 or combinations thereof, wherein the feedback signal from the DAC comprises a signal of negative polarity compared to the bitstream signal from the clocked comparator circuit and the feedback signal from the DAC closes a loop of a delta-sigma modulator (DSM).

Example 14

The integrating quantizer circuit of any of examples 10-13 or combinations thereof wherein the switch receives the phase two switch control signal for twice as long as the switch receives the phase one switch control signal.

Example 15

The integrating quantizer circuit of any of examples 10-14 or combinations thereof, wherein the integrator is a first integrator, the analog input signal is a first analog input signal, and the DAC is a first DAC, the circuit further comprising: a second DAC, wherein the second DAC receives the bitstream signal from the clocked comparator circuit; a second integrator, wherein the second integrator:

outputs the first analog input signal to the switch, receives an input signal comprising the sum of a second analog input signal and a DAC output signal from the second DAC.

Example 16

The integrating quantizer circuit of any of examples 10-15 or combinations thereof, wherein the analog input signal is a first analog input signal, the circuit further comprising a loop filter circuit, wherein the loop filter circuit: outputs the first analog input signal to the switch, receives a second analog input signal, and a DAC output signal from the DAC.

Example 17

A system comprising: a processor, wherein the processor outputs a timing signal; a sensor, wherein the sensor outputs an analog signal; and an integrating quantizer circuit, wherein the integrating quantizer circuit receives the analog signal from the sensor at a first input element and the timing signal at a second input element, the integrating quantizer circuit comprising: an integrator, wherein the integrator outputs an integrator output signal; a clocked comparator circuit, wherein the clocked comparator circuit receives the timing signal from the second input element and the integrator output signal; a digital to analog converter (DAC), wherein the DAC receives a bitstream signal from the clocked comparator circuit; and a switch, wherein: the switch receives the analog signal from the first input element at a first switch input port and the switch receives a feedback signal from the DAC at a second switch input port and at a third switch input port, the switch receives a phase one switch control signal and a phase two switch control signal, in response to the phase one switch control signal, the switch outputs the analog signal to the integrator; and in response to the phase two switch control signal, the switch outputs the feedback signal from the DAC to the integrator.

Example 18

The system of example 17, wherein the DAC is a self-oscillating, single-bit DAC and the feedback signal from the DAC comprises a signal of negative polarity compared to the bitstream signal from the clocked comparator circuit.

Example 19

The system of any of examples 17-18 or combinations thereof, wherein the integrating quantizer circuit is a continuous time (CT) dual-slope integrating quantizer that holds a quantization error after a first sample as a starting point for integrating the next sample.

Example 20

The system of any of examples 17-19 or combinations thereof, further comprising a delta-sigma modulator (DSM), wherein the feedback signal from the DAC closes a DSM loop.

Various examples of the disclosure have been described. These and other examples are within the scope of the following claims.

The invention claimed is:

1. A method comprising:
   receiving an analog signal at a first input of an integrating quantizer circuit, wherein the integrating quantizer circuit comprises a continuous time (CT) dual-slope integrating quantizer that holds a quantization error after a first sample as a starting point for integrating the next sample;
   receiving a clock signal at a second input of the integrating quantizer circuit, wherein the clock signal defines a clock period;
   determining a sample period, wherein the sample period is the clock period multiplied by a sum, N+M, wherein N and M are integers greater than zero;
   in response to receiving a phase one switch control signal, integrating, by the integrating quantizer circuit for M clock periods, the analog signal; and
   in response to receiving a phase two switch control signal, integrating, by the integrating quantizer circuit for N clock periods, a feedback signal, wherein the feedback signal comprises an output of a self-oscillating digital to analog converter (DAC).

2. The method of claim 1, wherein an integration final value for a first sample cycle of a plurality of sample cycles is an integration initial value for the next sample cycle of the plurality of sample cycle.

3. The method of claim 1, wherein a feedback input to a self-oscillating DAC comprises an inverted polarity output of a comparator, and wherein the comparator is single-bit, clocked, regenerative comparator, the method further comprising:
   in response to receiving a phase one signal, receiving, by the comparator, the integrated analog signal; and
   in response to receiving a phase two signal, receiving, by the comparator, the integrated feedback signal.

4. The method of claim 3, wherein the self-oscillating DAC is a single bit DAC and wherein the feedback signal from the DAC closes a loop of a delta-sigma modulator (DSM).

5. The method of claim 4, wherein the analog signal is a first analog signal, and the self-oscillating DAC is a first self-oscillating DAC, the method further comprising:
   receiving a second analog signal at a third input of the integrating quantizer circuit;
   summing the second analog signal with an output of a second self-oscillating DAC, wherein the second self-oscillating DAC:
      receives the inverted polarity output of the comparator, and
      receives a second reference voltage; and
   integrating the sum of the second analog input and the output of the second self-oscillating DAC, wherein the integrated analog signal to the comparator comprises the integrated sum of the second analog input and the output of the second self-oscillating DAC.

6. The method of claim 5, wherein the first reference voltage is approximately equal to the second reference voltage.

7. The method of claim 1, wherein N equals M.

8. The method of claim 1, wherein the analog signal is the output of a capacitive sensor.

9. The method of claim 1, wherein a component of the integrating quantizer determines the sample period.

10. An integrating quantizer circuit comprising:
    an integrator;
    a clocked comparator circuit, wherein the clocked comparator circuit receives a clock input and an integrator output signal;
    a digital to analog converter (DAC), wherein the DAC receives a bitstream signal from the clocked comparator circuit; and
    a switch, wherein:

in response to a phase one switch control signal, the switch outputs to the integrator an analog input signal; and in response to a phase two switch control signal, the switch outputs to the integrator, a feedback signal from the DAC, and wherein the integrating quantizer circuit comprises a continuous time (CT) dual-slope integrating quantizer that holds a quantization error after a first sample as a starting point for integrating the next sample.

11. The integrating quantizer circuit of claim 10, wherein the clocked comparator circuit is a single-bit, clocked, regenerative comparator.

12. The integrating quantizer circuit of claim 10, wherein the DAC is a self-oscillating DAC.

13. The integrating quantizer circuit of claim 10, wherein the feedback signal from the DAC comprises a signal of negative polarity compared to the bitstream signal from the clocked comparator circuit and the feedback signal from the DAC closes a loop of a delta-sigma modulator (DSM).

14. The integrating quantizer circuit of claim 10 wherein the switch receives the phase two switch control signal for twice as long as the switch receives the phase one switch control signal.

15. The integrating quantizer circuit of claim 10, wherein the integrator is a first integrator, the analog input signal is a first analog input signal, and the DAC is a first DAC, the circuit further comprising:
a second DAC, wherein the second DAC receives the bitstream signal from the clocked comparator circuit;
a second integrator, wherein the second integrator:
outputs the first analog input signal to the switch,
receives an input signal comprising the sum of a second analog input signal and a DAC output signal from the second DAC.

16. The integrating quantizer circuit of claim 10, wherein the analog input signal is a first analog input signal, the circuit further comprising a loop filter circuit, wherein the loop filter circuit:
outputs the first analog input signal to the switch,
receives a second analog input signal, and a DAC output signal from the DAC.

17. A system comprising:
a processor, wherein the processor outputs a timing signal;
a sensor, wherein the sensor outputs an analog signal; and
an integrating quantizer circuit, wherein:
the integrating quantizer circuit comprises a continuous time (CT) dual-slope integrating quantizer that holds a quantization error after a first sample as a starting point for integrating the next sample, and
the integrating quantizer circuit receives the analog signal from the sensor at a first input element and the timing signal at a second input element, the integrating quantizer circuit comprising:
an integrator, wherein the integrator outputs an integrator output signal;
a clocked comparator circuit, wherein the clocked comparator circuit receives the timing signal from the second input element and the integrator output signal;
a digital to analog converter (DAC), wherein the DAC receives a bitstream signal from the clocked comparator circuit; and
a switch, wherein:
the switch receives the analog signal from the first input element at a first switch input port and the switch receives a feedback signal from the DAC at a second switch input port and at a third switch input port, the switch receives a phase one switch control signal and a phase two switch control signal,
in response to the phase one switch control signal, the switch outputs the analog signal to the integrator; and
in response to the phase two switch control signal, the switch outputs the feedback signal from the DAC to the integrator.

18. The system of claim 17, wherein the DAC is a self-oscillating, single-bit DAC and the feedback signal from the DAC comprises a signal of negative polarity compared to the bitstream signal from the clocked comparator circuit.

19. The system of claim 17, further comprising a delta-sigma modulator (DSM), wherein the feedback signal from the DAC closes a DSM loop.

20. An integrating quantizer circuit comprising:
an integrator;
a clocked comparator circuit, wherein the clocked comparator circuit receives a clock input and an integrator output signal and the clocked comparator circuit is a single-bit, clocked, regenerative comparator;
a digital to analog converter (DAC), wherein the DAC receives a bitstream signal from the clocked comparator circuit; and
a switch, wherein:
in response to a phase one switch control signal, the switch outputs to the integrator an analog input signal; and
in response to a phase two switch control signal, the switch outputs to the integrator, a feedback signal from the DAC
wherein the integrating quantizer circuit comprises a continuous time (CT) dual-slope integrating quantizer that holds a quantization error after a first sample as a starting point for integrating the next sample.

21. An integrating quantizer circuit comprising:
an integrator;
a clocked comparator circuit, wherein the clocked comparator circuit receives a clock input and an integrator output signal;
a digital to analog converter (DAC), wherein the DAC receives a bitstream signal from the clocked comparator circuit; and
a switch, wherein:
in response to a phase one switch control signal, the switch outputs to the integrator an analog input signal;
in response to a phase two switch control signal, the switch outputs to the integrator, a feedback signal from the DAC, wherein the feedback signal from the DAC comprises a signal of negative polarity compared to the bitstream signal from the clocked comparator circuit and the feedback signal from the DAC closes a loop of a delta-sigma modulator (DSM); and
wherein the integrating quantizer circuit comprises a continuous time (CT) dual-slope integrating quantizer that holds a quantization error after a first sample as a starting point for integrating the next sample.

22. An integrating quantizer circuit comprising:
an integrator;
a clocked comparator circuit, wherein the clocked comparator circuit receives a clock input and an integrator output signal;

a digital to analog converter (DAC), wherein the DAC receives a bitstream signal from the clocked comparator circuit; and a switch, wherein:
in response to a phase one switch control signal, the switch outputs to the integrator an analog input signal, and
the switch receives the phase two switch control signal for twice as long as the switch receives the phase one switch control signal;

in response to a phase two switch control signal, the switch outputs to the integrator, a feedback signal from the DAC; and wherein the integrating quantizer circuit comprises a continuous time (CT) dual-slope integrating quantizer that holds a quantization error after a first sample as a starting point for integrating the next sample.

23. An integrating quantizer circuit comprising:
a first integrator;
a clocked comparator circuit, wherein the clocked comparator circuit receives a clock input and an integrator output signal from the first integrator;
a first digital to analog converter (DAC) and a second DAC, wherein:
the first DAC receives a bitstream signal from the clocked comparator circuit, and
the second DAC receives the bitstream signal from the clocked comparator circuit;
a switch, wherein:
in response to a phase one switch control signal, the switch outputs to the first integrator a first analog input signal, and
in response to a phase two switch control signal, the switch outputs to the integrator, a feedback signal from the first DAC;
a second integrator, wherein the second integrator:
outputs the first analog input signal to the switch,
receives an input signal comprising the sum of a second analog input signal and a DAC output signal from the second DAC, and
wherein the integrating quantizer circuit comprises a continuous time (CT) dual-slope integrating quantizer that holds a quantization error after a first sample as a starting point for integrating the next sample.

24. An integrating quantizer circuit comprising:
an integrator;
a clocked comparator circuit, wherein the clocked comparator circuit receives a clock input and an integrator output signal;
a digital to analog converter (DAC), wherein the DAC receives a bitstream signal from the clocked comparator circuit; and a switch, wherein:
in response to a phase one switch control signal, the switch outputs to the integrator a first analog input signal; and
in response to a phase two switch control signal, the switch outputs to the integrator, a feedback signal from the DAC a loop filter circuit, wherein the loop filter circuit:
outputs the first analog input signal to the switch,
receives a second analog input signal, and
receives a DAC output signal from the DAC, and
wherein the integrating quantizer circuit comprises a continuous time (CT) dual-slope integrating quantizer that holds a quantization error after a first sample as a starting point for integrating the next sample.

25. A system comprising:
a processor, wherein the processor outputs a timing signal;
a sensor, wherein the sensor outputs an analog signal; and
an integrating quantizer circuit, wherein:
the integrating quantizer circuit receives the analog signal from the sensor at a first input element and the timing signal at a second input element, the integrating quantizer circuit comprising:
an integrator, wherein the integrator outputs an integrator output signal;
a clocked comparator circuit, wherein the clocked comparator circuit receives the timing signal from the second input element and the integrator output signal;
a digital to analog converter (DAC), wherein the DAC receives a bitstream signal from the clocked comparator circuit; and
a switch, wherein:
the switch receives the analog signal from the first input element at a first switch input port and the switch receives a feedback signal from the DAC at a second switch input port and at a third switch input port, the switch receives a phase one switch control signal and a phase two switch control signal,
in response to the phase one switch control signal, the switch outputs the analog signal to the integrator; and
in response to the phase two switch control signal, the switch outputs the feedback signal from the DAC to the integrator a delta-sigma modulator (DSM), wherein the output signal from the DAC closes a DSM loop.

* * * * *